US010847529B2

(12) United States Patent
Yoo et al.

(10) Patent No.: US 10,847,529 B2
(45) Date of Patent: Nov. 24, 2020

(54) SUBSTRATE PROCESSING METHOD AND DEVICE MANUFACTURED BY THE SAME

(71) Applicant: ASM IP Holding B.V., Almere (NL)

(72) Inventors: Tae Hee Yoo, Bucheon-si (KR); Yoon Ki Min, Seoul (KR); Yong Min Yoo, Seoul (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/951,626

(22) Filed: Apr. 12, 2018

(65) Prior Publication Data

US 2018/0301460 A1    Oct. 18, 2018

Related U.S. Application Data

(60) Provisional application No. 62/485,302, filed on Apr. 13, 2017.

(51) Int. Cl.
*H01L 21/311* (2006.01)
*H01L 27/1157* (2017.01)
(Continued)

(52) U.S. Cl.
CPC ...... *H01L 27/1157* (2013.01); *H01L 21/0217* (2013.01); *H01L 21/0228* (2013.01);
(Continued)

(58) Field of Classification Search
CPC ........... H01L 27/1157; H01L 27/11575; H01L 21/31111; H01L 21/76802;
(Continued)

(56) References Cited

U.S. PATENT DOCUMENTS 3,708,728 A   1/1973  Sterling et al.
3,925,337 A  12/1975  Heiberger
(Continued)

FOREIGN PATENT DOCUMENTS

EP   0387403    9/1990
EP   0394054   10/1990
(Continued)

OTHER PUBLICATIONS

Closser et al., "Molecular Layer Deposition of a Highly Stable Oxycarbide Thin Film Using an Organic Chlorosilane and Water", ACS Appl. Mater. Interfaces 2018, 10, pp. 24266-24274.
(Continued)

*Primary Examiner* — Hrayr A Sayadian
(74) *Attorney, Agent, or Firm* — Knobbe Martens Olson & Bear LLP

(57) ABSTRACT

Provided is a substrate processing method that may prevent the non-uniformity of the thickness of landing pads deposited on each step in the process of selectively depositing a landing pad in a vertical NAND device having a stepped structure. The substrate processing method includes stacking, a plurality of times, a stack structure including an insulating layer and a sacrificial layer and etching the stack structure to form a stepped structure having an upper surface, a lower surface, and a side surface connecting the upper surface and the lower surface. The method also includes forming a barrier layer on the stepped structure, forming a mask layer on the barrier layer and exposing at least a portion of the barrier layer by etching at least a portion of the mask layer with a first etching solution The method further includes etching the exposed barrier layer with a second etching solution and etching the mask layer with a third etching solution.

9 Claims, 23 Drawing Sheets

(51) Int. Cl.
  *H01L 21/768* (2006.01)
  *H01L 27/11524* (2017.01)
  *H01L 21/02* (2006.01)
  *H01L 27/11575* (2017.01)
  *H01L 27/11548* (2017.01)
  *H01L 27/11556* (2017.01)
  *H01L 27/11582* (2017.01)

(52) U.S. Cl.
  CPC .... *H01L 21/0234* (2013.01); *H01L 21/02164* (2013.01); *H01L 21/02219* (2013.01); *H01L 21/02274* (2013.01); *H01L 21/31111* (2013.01); *H01L 21/31144* (2013.01); *H01L 21/76802* (2013.01); *H01L 21/76877* (2013.01); *H01L 27/11524* (2013.01); *H01L 27/11548* (2013.01); *H01L 27/11575* (2013.01); *H01L 27/11556* (2013.01); *H01L 27/11582* (2013.01)

(58) Field of Classification Search
  CPC ......... H01L 21/76877; H01L 27/11524; H01L 21/02164; H01L 21/0217; H01L 21/02219; H01L 21/02274; H01L 21/0228; H01L 21/0234; H01L 21/31144; H01L 27/11548; H01L 27/11582; H01L 27/11556
  USPC .................................. 257/288, 438
  See application file for complete search history.

(56) References Cited

U.S. PATENT DOCUMENTS

| | | |
|---|---|---|
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo, Jr. et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,159,871 A | 12/2000 | Loboda et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,410,462 B1 | 6/2002 | Yang et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,583,048 B1 | 6/2003 | Vincent et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskelä et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin et al. |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,074,690 B1 | 7/2006 | Gauri et al. |
| 7,115,534 B2 | 10/2006 | Nguyen et al. |
| 7,115,974 B2 | 10/2006 | Wu et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,329,590 B2 | 2/2008 | Elers et al. |
| 7,405,158 B2 | 7/2008 | Lai et al. |
| 7,410,666 B2 | 8/2008 | Elers et al. |
| 7,416,981 B2 | 8/2008 | Lee et al. |
| 7,611,751 B2 | 11/2009 | Elers |
| 7,749,871 B2 | 7/2010 | Elers et al. |
| 7,776,396 B2 | 8/2010 | Kobrin et al. |
| 7,794,798 B2 | 9/2010 | Hautala |
| 7,824,492 B2 | 11/2010 | Tois et al. |
| 8,217,446 B2 | 7/2012 | Fukuzumi et al. |
| 9,111,746 B2 | 8/2015 | Ranjan et al. |
| 9,171,736 B2 | 10/2015 | Raley et al. |
| 9,243,324 B2 | 1/2016 | Bowen et al. |
| 9,425,038 B2 | 8/2016 | Shimizu |
| 9,455,138 B1 | 9/2016 | Fukazawa et al. |
| 9,784,695 B2 | 10/2017 | Blendl |
| 9,786,491 B2 | 10/2017 | Suzuki et al. |
| 9,786,492 B2 | 10/2017 | Suzuki et al. |

(56) References Cited

U.S. PATENT DOCUMENTS

| | | |
|---|---|---|
| 10,424,477 B2 | 9/2019 | Niskanen et al. |
| 10,453,675 B2 | 10/2019 | O'Neill |
| 2001/0004479 A1 | 6/2001 | Cheung et al. |
| 2001/0005546 A1 | 6/2001 | Cheung et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0015764 A1 | 1/2003 | Raaijmakers et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0119305 A1* | 6/2003 | Huang ............. H01L 21/76813 438/633 |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0240820 A1 | 12/2004 | Johnson et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0236694 A1 | 10/2005 | Wu et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0079099 A1 | 4/2006 | Nguyen et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0148350 A1 | 6/2007 | Rahtu et al. |
| 2007/0218670 A1 | 9/2007 | Ishizaka |
| 2007/0251444 A1 | 11/2007 | Gros-Jean et al. |
| 2008/0102204 A1 | 5/2008 | Elers |
| 2008/0102613 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1 | 4/2009 | Nemani |
| 2009/0211526 A1 | 8/2009 | Tanaka et al. |
| 2009/0315093 A1 | 12/2009 | Li et al. |
| 2010/0092781 A1 | 4/2010 | Zambov et al. |
| 2010/0148903 A1 | 6/2010 | Yin et al. |
| 2010/0239742 A1 | 9/2010 | Larson-Smith et al. |
| 2010/0297545 A1 | 11/2010 | Yoo et al. |
| 2011/0159202 A1 | 6/2011 | Matsushita et al. |
| 2011/0262642 A1 | 10/2011 | Xiao et al. |
| 2011/0278533 A1 | 11/2011 | Hillhouse et al. |
| 2012/0003831 A1 | 1/2012 | Kang et al. |
| 2012/0119283 A1 | 5/2012 | Lee et al. |
| 2012/0141770 A1 | 6/2012 | Cadet et al. |
| 2012/0208347 A1 | 8/2012 | Hwang et al. |
| 2012/0269962 A1 | 10/2012 | Blomberg et al. |
| 2013/0078454 A1 | 3/2013 | Thompson et al. |
| 2013/0112605 A1 | 5/2013 | Wyndham et al. |
| 2013/0115763 A1 | 5/2013 | Takamure et al. |
| 2013/0134372 A1 | 5/2013 | Sakuma et al. |
| 2013/0196082 A1 | 8/2013 | Spence |
| 2013/0330935 A1 | 12/2013 | Varadarajan |
| 2014/0030432 A1 | 1/2014 | Leu et al. |
| 2014/0048131 A1 | 2/2014 | Tanaka et al. |
| 2014/0272194 A1 | 9/2014 | Xiao et al. |
| 2014/0295109 A1 | 10/2014 | Sakakura |
| 2014/0302267 A1 | 10/2014 | Wynne et al. |
| 2014/0349107 A1 | 11/2014 | Thoumazet et al. |
| 2014/0367764 A1 | 12/2014 | Lee et al. |
| 2015/0087156 A1 | 3/2015 | Kamimura et al. |
| 2015/0118865 A1 | 4/2015 | Shimizu |
| 2015/0214103 A1 | 7/2015 | Matsuda |
| 2015/0217240 A1 | 8/2015 | Van Tuel et al. |
| 2015/0217330 A1 | 8/2015 | Haukka et al. |
| 2015/0275355 A1 | 10/2015 | Mallikarjunan et al. |
| 2015/0303056 A1 | 10/2015 | Varadarajan et al. |
| 2015/0303101 A1 | 10/2015 | Blomberg et al. |
| 2015/0376211 A1 | 12/2015 | Girard et al. |
| 2016/0064281 A1 | 3/2016 | Izumi et al. |
| 2016/0093485 A1 | 3/2016 | Kobayashi et al. |
| 2016/0225616 A1 | 8/2016 | Li et al. |
| 2016/0336338 A1* | 11/2016 | Song .................. H01L 23/5226 |
| 2017/0140924 A1 | 5/2017 | Suzuki et al. |
| 2017/0213726 A1 | 7/2017 | Saly et al. |
| 2017/0309476 A1 | 10/2017 | Venkatasubramanian et al. |
| 2017/0323782 A1 | 11/2017 | Suzuki et al. |
| 2017/0352680 A1 | 12/2017 | Shin et al. |
| 2017/0365462 A1 | 12/2017 | Varadarajan |
| 2018/0005814 A1 | 1/2018 | Kumar et al. |
| 2018/0013078 A1 | 1/2018 | Lee et al. |
| 2018/0122742 A1* | 5/2018 | Ha .................... H01L 27/1157 |
| 2018/0151355 A1 | 5/2018 | Fukazawa |
| 2018/0182618 A1 | 6/2018 | Blanquart et al. |
| 2018/0350587 A1 | 12/2018 | Jia et al. |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1158070 | 11/2001 |
| EP | 1167567 | 1/2002 |
| EP | 2620440 | 7/2013 |
| EP | 3196336 | 7/2017 |
| JP | 58-033841 | 2/1983 |
| JP | H06-037041 | 2/1994 |
| JP | H06-069157 | 3/1994 |
| JP | H07-230957 | 8/1995 |
| JP | H08-264530 | 10/1996 |
| JP | 09-087857 | 3/1997 |
| JP | 2004-288979 | 10/2004 |
| JP | 2006-040936 | 2/2006 |
| JP | 2009-083511 | 4/2009 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| KR | 2018-0005128 | 1/2018 |
| TW | 201021202 A | 1/2010 |
| TW | 201403759 A | 1/2014 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |

(56) References Cited

FOREIGN PATENT DOCUMENTS

| | | |
|---|---|---|
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2006/097525 | 9/2006 |
| WO | WO 2007/041089 | 4/2007 |
| WO | WO 2008/051851 | 5/2008 |
| WO | WO 2008/121478 | 10/2008 |
| WO | WO 2008/137399 | 11/2008 |
| WO | WO 2018/204709 | 11/2018 |

OTHER PUBLICATIONS

Gallis et al., "White light emission from amorphous silicon oxycarbide (a-SiCxOy) thin films: Role of composition and postdeposition annealing", Applied Physics Letters 97, 2010, pp. 0810905-1-0810905-3.
Lee et al., "Characteristics of low-k SiOC films deposited via atomic layer deposition", Thin Solid Films 645 (2018), pp. 334-339.
Wrobel et al., "Silicon Oxycarbide Films Produced by Remote Microwave Hydrogen Plasma CVD using a Tetramethyldisiloxane Precursor: Growth Kinetics, Structure, Surface Morphology, and Properties", Chem. Vap. Deposition 2015, 21, pp. 307-318.
File History of U.S. Appl. No. 14/939,984, filed Nov. 12, 2015.
File History of U.S. Appl. No. 15/707,749, filed Sep. 18, 2017.
File History of U.S. Appl. No. 15/707,878, filed Sep. 18, 2017.
File History of U.S. Appl. No. 15/588,026, filed May 5, 2017.
File History of U.S. Appl. No. 15/787,342, filed Oct. 18, 2017.
File History of U.S. Appl. No. 15/951,644, filed Apr. 12, 2018.
1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: ANONYMOUS[ANON], Sep. 19, 2005.
Aarik et al., "Influence of substrate temperature on atomic layer growth and properties of HfO2 thin films," Thin Solid Films, vol. 340, 1999, pp. 110-116.
Alen et al., "Atomic Layer Deposition of Ta(Al)N(C) Thin Films Using Trimethylaluminum as a Reducing Agent," Journal of the Electrochemical Society, vol. 148, No. 10, pp. G566-G571, 2001.
Andricacos et al., "Damascene copper electroplating for chip," IBM Jour. Research and Dev., 1998, vol. 42, Issue 5, pp. 567-574.
Bain et al., "Deposition of tungsten by plasma enhanced chemical vapour deposition," J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).
Chookarjorn et al, "Design of Stable Nanocrystalline Alloys," Science Magazine, vol. 337, pp. 951-954, Aug. 24, 2012.
Elers et al., "NbCl5 as a precursor in atomic layer epitaxy," Applied Surface Science, Jul. 9, 1994, vol. 82/83, pp. 468-474.
Favis et al., "Atomic layer epitaxy of silicon, silicon/germanium and silicon carbide via extraction/exchange processes," Avail. NTIS. Report, 1991, pp. 33.
Fuyuki et al., "Atomic layer epitaxy controlled by surface superstructures in silicon carbide," Thin Solid Films, 1993, vol. 225, Issue 1-2, pp. 225-229.
Fuyuki et al., "Atomic layer epitaxy of cubic silicon carbide by gas source MBE using surface superstructure," J. Cryst. Growth, 1989, vol. 95, Issue 1-4, pp. 461-463.
Girolami et al., "Tailored Organometallics as Low-Temperature CVD Precursors to Thin Films," Materials Research Society Symposium Proceedings, 1988, vol. 121, pp. 429-438.

Gordon et al., "A Kinetic Model for Step Coverage by Atomic Layer Deposition in Narrow Holes or Trenches," Chemical Vapor Deposition, 2003, vol. 9, No. 2, pp. 73-78.
Hara et al., "Atomic layer control of .beta.-silicon carbide (001) surface," Springer Proc. Phys., 1992, pp. 90-95.
Hiltunen et al., "Nitrides of titanium, niobium, tantalum and molybdenum grown as thin films by the atomic layer epitaxy method," Thin Solid Films, 1988, vol. 166, pp. 149-154.
Hultman et al., "Review of the Thermal and Mechanical Stability of TiN-based Thin Films," Zeitscrift Fur Metallkunde 90 (10): 803-813 (1999).
Ihanus et al., "ALE growth of ZnS1—xSex thin films by substituting surface sulfur with elemental selenium," Appl. Surface Sci., 112:154-158 (1997).
International Search Report and Written Opinion dated Apr. 7, 2008, Application No. PCT/US2007/082131.
International Search Report and Written Opinion dated Jun. 25, 2015 in Application No. PCT/US2015/023492.
Jehn et al., Gmelin Handbook of Inorganic and Organometallic Chemistry, 8th Edition, 1993, vol. A 5b, Issue 54, pp. 131-154.
Jeon et al., "A Study on the Characteristics of TiN Thin Film Deposited by Atomic Layer Chemical Vapor Deposition Method," J. Vac .Sci. Technol. A, 2000, vol. 18, Issue 4, pp. 1595-1598.
Juppo et al., "Deposition of copper films by an alternate supply of CuCl and Zn," J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., "Atomic-layer-deposited WNxCy thin films as diffusion barrier for copper metallization," Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kim et al., "Pre-treatments applied to oxidized aluminum surfaces to modify the interfacial bonding with bis-1, 2-(triethoxysilyl) ethane (BTSE)—Part I. High-purity Al with native oxide," Applied Surface Science 252(5), 2005, pp. 1293-1304.
Kim et al., "Pre-treatments applied to oxidized aluminum surfaces to modify the interfacial bonding with bis-1,2-(triethoxysilyl) ethane (BTSE)—Part II. Anodized 7075-T6 Al alloy," Applied Surface Science 252(5), 2005, pp. 1305-1312.
Kirk-Othmer, Encyclopedia of Chemical Technology, John Wiley & Sons, Inc., 1992, vol. 4, pp. 841-878.
Klaus et al., "Atomic layer deposition of tungsten and tungsten nitride using sequential surface reactions," AVS 46th International Symposium, 1999, Seattle, WA, US.
Klaus et al., "Atomic Layer Deposition of Tungsten Nitride Films Using Sequential Surface Reactions," Journal of the Electrochemical Society, 2000, vol. 147, Issue 3, pp. 1175-1181.
Klaus et al., "Atomic layer deposition of tungsten using sequential surface chemistry with a sacrificial stripping reaction," Thin Solid Films, 2000, vol. 360, pp. 145-153.
Klaus et al., "Atomically controlled growth of tungsten and tungsten nitride using sequential surface reactions," Applied Surface Science, 2000, vol. 162-163, pp. 479-491.
Kukli et al., "Properties of (Nb1—xTax)2O5 Solid Solutions and (Nb1—xTax)2O5—ZrO2 Nanolaminates Growth by Atomic Layer Epitaxy," NanoStructured Materials, 1997, vol. 8, pp. 785-793.
Lai et al., "Precursors for Organometallic Chemical Vapor Deposition of Tungsten Carbide Films," Chem. Mater., 1995, vol. 7, pp. 2284-2292.
Lakomaa et al., "Surface reactions in Al2O3 growth from trimethylaluminum and water by atomic layer epitaxy," Applied Surface Science, vol. 107, pp. 107-115 (1996).
Leskelä et al., "ALD precursor chemistry: Evolution and future challenges," Jour. Phys. IV France 9, 1999, pp. 837-852.

(56) References Cited

OTHER PUBLICATIONS

Ludviksson et al., "Low-Temperature Thermal CVD of Ti—Al Metal Films Using a Strong Reducing Agent," Chem. Vap. Deposition, 1998, vol. 4, Issue 4, pp. 129-132.
Martensson et al., "Atomic Layer Epitaxy of Copper and Tantalum, Chemical Vapor Deposition," 1997, vol. 3, Issue 1, pp. 45-50.
Martensson et al., "Cu(THD)2 as Copper Source in Atomic Layer Epitaxy," Electrochemical Society Proceedings, vol. 97-25, (1997) pp. 1529-1536.
Martensson, "Use of atomic layer epitaxy for fabrication of Si/TiN/Cu structures," J. Vac. Sci. Technol. B, Sep./Oct. 1999, vol. 17, Issue 5, pp. 2122-2128.
Matsunami et al., "Hetero-interface control and atomic layer epitaxy of SiC," Applied Surface Science, 1997, vol. 112, pp. 171-175.
Min et al., "Atomic Layer Deposition of TiN Films by Alternate Supply of Tetrakis (ethylmethylamino)-Titanium and Ammonia," Jpn. J. Appl. Phys., 1998, vol. 37, pp. 4999-5004.
Min et al., "Atomic Layer Deposition of TiN Thin Films by Sequential Introduction of Ti Precursor and HN3," Mat. Res. Soc. Symp. Proc., 1998, vol. 514, pp. 337-342.
Nakajima et al., "Chemical Vapor Deposition of Tungsten Carbide, Molybdenum Carbide Nitride, and Molybdenum Nitride Films," J. Electrochem. Soc., Jun. 1997, vol. 144, Issue 6, pp. 2096-2100.
Polyakov et al., "Growth of GaBN Ternary Solutions by Organometallic Vapor Phase Epitaxy," Journal of Electronic Materials, 1997, vol. 26, Issue 3, pp. 237-242.
Ritala et al., "Controlled Growth of TaN, Ta3N5, and TaOxNy Thin Films by Atomic Layer Deposition," Chem. Mater., 1999, vol. 11, pp. 1712-1718.
Ritala et al., "Atomic Layer Epitaxy Growth of TiN Thin Films from TiI4 and NH3," J. Electrochem. Soc., Aug. 1998, vol. 145, Issue 8, pp. 2914-2920.
Ritala et al., "Atomic layer epitaxy growth of TiN thin films," J. Electrochem. Soc., 1995, vol. 142, Issue 8, pp. 2731-2737.
Ritala et al., "Effects of intermediate zinc pulses on properties of TiN and NbN films deposited by atomic layer epitaxy," Appl. Surf. Sci., 1997, vol. 120, pp. 199-212.
Ritala et al., "Perfectly conformal TiN and Al2O3 films deposited by atomic layer deposition," Chem. Vapor Deposition, 1999, vol. 5, pp. 7-9.
Ritala et al.,"Surface roughness reduction in atomic layer epitaxy grown of titanium dioxide thin films," Thin Solid Films, vol. 249, pp. 155-162 (1994).
Sadayuki et al., "Sub-atomic layer growth of SiC at low temperatures," Japanese Journal of Applied Physics, 1995, vol. 34, Issue 11, pp. 6166-6170.
Sherman et al., "Plasma enhanced atomic layer deposition of Ta for diffusion barrier applications," AVS 46th International Symposium, Oct. 26, 1999, Seattle, WA, US.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties," Chemical Vapor Deposition, 2008, vol. 14, pp. 334-338.
Suntola, "Atomic Layer Epitaxy," Handbook of Crystal Growth 3, Ch. 14, pp. 601-663 (1994).
Tulhoff et al., Ullmann's Encyclopedia of Industrial Chemistry, 5th, Completely Revised Edition, 1986, vol. A5, pp. 61-77.
U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.
U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.
U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.
U.S. Appl. No. 11/286,203, filed Nov. 22, 2005 including prosecution history, including but not limited to Office Action dated Sep. 28, 2007.
U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.
U.S. Appl. No. 14/255,799, filed Apr. 17, 2014 including prosecution history, including but not limited to, Office Action dated Dec. 1, 2016, Final Office Action dated Aug. 29, 2017, and Advisory Action dated Dec. 21, 2017.
U.S. Appl. No. 14/939,984, filed Nov. 12, 2015 including prosecution history, including but not limited to, Office Action dated Feb. 3, 2017, and Notice of Allowance dated Jun. 7, 2017.
U.S. Appl. No. 15/342,943, filed Nov. 3, 2016 including prosecution history, including but not limited to Notice of Allowance dated Jun. 13, 2017.
Utriainen et al., "Controlled Electrical Conductivity in $SnO_2$ Thin Films by Oxygen or Hydrocarbon Assisted Atomic Layer Epitaxy," J. Electrochem. Soc. 146(1):189-193 (1999).
Wong et al., "Barriers for copper interconnections," Solid State Technology, 1999, pp. 1-4.
Yang et al., "Atomic Layer Deposition of Tungsten Film from $WF_6/B_2H_6$: Nucleation Layer for Advanced Semiconductor Devices," Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).
Amano et al., "Improved brushing durability of titanium dioxide coating on polymethyl methacrylate substrate by prior treatment with acryloxypropyl trimethoxysilane-based agent for denture application", Dental Materials Journal 2010, 29(1): pp. 97-103.
Diaz-Benito et al., "Hydrolysis study of bis-1,2-(triethoxylsilyl)ethane silane by NMR", Colloids and Surfaces A; Physicochemical and Engineering Aspects, 369 (2010), pp. 53-56.
Ibrahim et al., "Organosilica bis(triethoxysilyl)ethane (BTESE) membranes for gas permeation (GS) and reverse osmosis (RO): The effect of preparation conditions on structure, and the correlation between gas and liquid permeation properties", Journal of Membrane Science, 526 (2017), pp. 242-251.
Wahab et al., "Hybrid periodic mesoporous organosilica materials prepared from 1,2-bis(triethoxysilyl)ethane and (3-cyanopropyl)triethoxysilane", Microporous and Mesoporous Materials 69 (2004), pp. 19-27.
File History of U.S. Appl. No. 16/576,328, filed Sep. 19, 2019.
File History of U.S. Appl. No. 16/208,350, filed Dec. 3, 2018.
File History of U.S. Appl. No. 16/811,258, filed Mar. 6, 2020.

\* cited by examiner

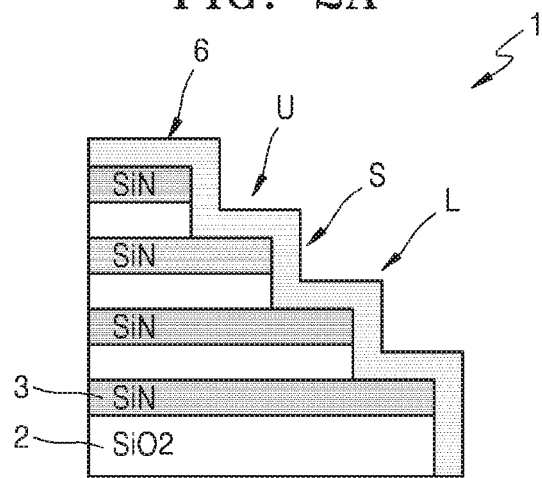
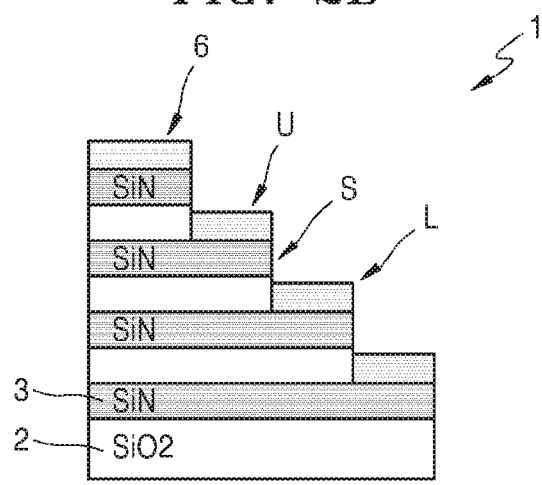
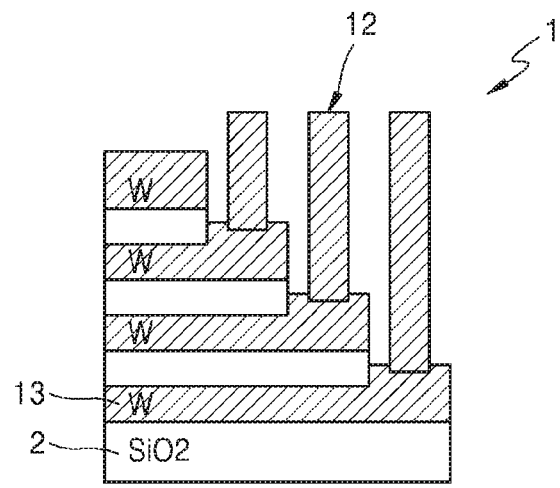

SUBSTRATE PROCESSING METHOD AND DEVICE MANUFACTURED BY THE SAME

CROSS-REFERENCE TO RELATED APPLICATION

This application claims the benefit of U.S. Provisional Application No. 62/485,302, filed on Apr. 13, 2017, in the United States Patent and Trademark Office, the disclosure of which is incorporated herein in its entirety by reference.

BACKGROUND

Field

One or more embodiments relate to substrate processing methods using thin film deposition technology and devices manufactured by the same, and more particularly, to film etching methods for applying a landing pad to a stepped structure of a three-dimensional vertical NAND (3D VNAND) device.

Description of the Related Technology

In general, a $SiO_2$/SiN stack structure can be stacked a plurality of times to form a gate stack of VNAND. Then, the gate stack can then etched to expose a SiN layer to form a stepped structure. The exposed SiN layer is replaced by a conductive layer, such as tungsten, and the conductive layer can serve as a word line and can be connected to a contact plug.

However, when a via contact hole is formed by dry etching, the via contact hole may be connected to two or more conductive layers through the gate stack due to excessive etching. This possibility risks an electrical short circuit when driving a semiconductor device.

SUMMARY

One or more embodiments include selectively depositing a landing pad on a region of a stepped structure even without performing a separate photolithography process.

One or more embodiments include selectively depositing a landing pad of the same thickness on each step when selectively forming a landing pad in a vertical NAND (VNAND) device having a stepped structure.

One or more embodiments include depositing a landing pad having the same thickness on each step through a simpler process even when the number of stack structures of a VNAND device increases.

One or more embodiments include a three-dimensional (3D) semiconductor device that can reduce or prevent the risk of shorting that can occur when a via contact hole is connected, through a landing pad, to another landing pad.

Additional aspects will be set forth in part in the description which follows and, in part, will be apparent from the description, or may be learned by practice of the presented embodiments.

According to one or more embodiments, a substrate processing method includes: stacking a stack structure including an insulating layer and a sacrificial layer a plurality of times; etching the stack structure to form a structure having an upper surface, a lower surface, and a side surface connecting the upper surface and the lower surface; forming a barrier layer on the structure to cover the structure; forming a mask layer on the barrier layer to cover the barrier layer; exposing at least a portion of the barrier layer by etching at least a portion of the mask layer; etching the exposed barrier layer; and etching the mask layer.

According to an embodiment, a thickness of the barrier layer located on the upper surface and the lower surface of the structure may be uniform during the exposing of the at least a portion of the barrier layer to the etching of the mask layer.

According to another embodiment, the etching of the exposed barrier layer may include isotropically etching the barrier layer to form a barrier layer having a width narrower than a width of the mask layer located on the upper surface and the lower surface of the structure.

According to another embodiment, the exposing of the at least a portion of the barrier layer may include etching the mask layer on the side surface of the structure.

According to another embodiment, the substrate processing method may further include selectively densifying a barrier layer located on the upper surface and the lower surface of the structure among the barrier layer before the forming of the mask layer on the barrier layer.

According to another embodiment, an etch rate of a barrier layer located on the upper surface and the lower surface of the structure may be lower than an etch rate of a barrier layer located on the side surface of the structure during the etching of the exposed barrier layer.

According to another embodiment, the substrate processing method may further include selectively densifying a mask layer located on the upper surface and the lower surface of the structure among the mask layer before the exposing of the at least a portion of the barrier layer.

According to another embodiment, a sacrificial word line structure may include the sacrificial layer and the barrier layer, the substrate processing method may further include: forming an inter-layer insulating layer on the sacrificial word line structure; removing the sacrificial word line structure; and forming a conductive word line structure corresponding to a space from which the sacrificial word line structure is removed, the conductive word line structure may include: a first conductive layer extending toward a channel; and a second conductive layer on the first conductive layer, and each of both sidewalls of the second conductive layer may have a portion recessed from the sidewall of the second conductive layer toward the other sidewall thereof.

According to one or more embodiments, a substrate processing method may include: stacking n first silicon oxide layers and n first silicon nitride layers alternately in a first direction, wherein the n is a natural number greater than or equal to 2; etching the stacked first silicon oxide layers and first silicon nitride layers to form a n-story stepped structure having an upper surface, a lower surface, and a side surface connecting the upper surface and the lower surface; forming a second silicon nitride layer on the upper surface, the lower surface, and the side surface of the stepped structure; selectively densifying the second silicon nitride layer on the upper surface and the lower surface; forming a second silicon oxide layer on the second silicon nitride layer; selectively densifying the second silicon oxide layer on the upper surface and the lower surface; removing a non-densified portion of the second silicon oxide layer; removing a non-densified portion of the second silicon nitride layer; and removing a densified portion of the second silicon oxide layer.

According to another embodiment, a thickness of a second silicon nitride layer densified during the selective densifying of the second silicon nitride layer may not change during the removing of the non-densified portion of the second silicon oxide layer to the removing of the densified portion of the second silicon oxide layer.

According to another embodiment, the removing of the non-densified portion of the second silicon oxide layer may include removing a non-densified portion of the second silicon oxide layer by using a first etching solution, and the removing of the densified portion of the second silicon oxide layer may include removing a densified portion of the second silicon nitride layer by using a second etching solution. In an additional embodiment, the first etching solution and the second etching solution may be the same solution, and an etching time of the removing of the densified portion of the second silicon oxide layer may be longer than an etching time of the removing of the non-densified portion of the second silicon oxide layer.

According to another embodiment, each step of the stepped structure may include: the first silicon oxide layer formed at a lower portion thereof; and the first silicon nitride layer formed on the first silicon oxide layer, a second silicon nitride layer formed on a first silicon nitride layer forming a kth step (k: a natural number greater than or equal to 2 and smaller than or equal to n) of the stepped structure may include, after the removing of the non-densified portion of the second silicon nitride layer: a first sidewall facing one side of a first silicon oxide layer forming a (k+1)th step of the stepped structure; and a second sidewall facing the first sidewall, each of a first sidewall and a second sidewall of a second silicon nitride layer formed on each step of the stepped structure may have a portion recessed in a side direction thereof, after the removing of the non-densified portion of the second silicon nitride layer, the recessed portion may extend in a second direction, and the second direction may be perpendicular to the first direction. In an additional embodiment, second silicon nitride layers formed on each step of the stepped structure may be formed to be spaced apart from each other in a third direction, after the removing of the non-densified portion of the second silicon nitride layer, and the third direction may be perpendicular to the first direction and the second direction.

According to another embodiment, second silicon nitride layers formed on each step of the stepped structure may have different densities, after the selective densifying of the second silicon nitride layer.

According to another embodiment, second silicon nitride layers formed on each step of the stepped structure may have the same thickness in the first direction, after the removing of the non-densified portion of the second silicon nitride layer.

According to one or more embodiments, a semiconductor device may include: a substrate; at least one memory cell string extending to protrude on the substrate; a first word line connected to a first memory cell of the at least one memory cell string; and a second word line connected to a second memory cell of the at least one memory cell string, wherein each of the first word line and the second word line may include: a first conductive layer extending toward a channel; and a second conductive layer on the first conductive layer, and the second conductive layers of the first word line and the second word line may have a portion recessed in a side direction thereof from each of both sidewalls thereof, and a side-direction width of a center portion of the second conductive layer may be smaller than a side-direction width of an upper surface and a lower surface of the second conductive layer.

According to another embodiment, a thickness of the second conductive layer of the first word line may be equal to a thickness of the second conductive layer of the second word line.

According to another embodiment, the recessed portion may have a round shape or a shape having a predetermined curvature.

According to another embodiment, the second conductive layer of the first word line and the second conductive layer of the second word line may not overlap each other in a direction perpendicular to the upper surface of the second conductive layer of the first word line.

BRIEF DESCRIPTION OF THE DRAWINGS

These and/or other aspects will become apparent and more readily appreciated from the following description of the embodiments, taken in conjunction with the accompanying drawings.

FIGS. 2A, 2B and 2C schematically illustrate a process of depositing and selectively etching a barrier layer on a stepped structure of a three-dimensional (3D) semiconductor device.

DETAILED DESCRIPTION

Figure 1A:
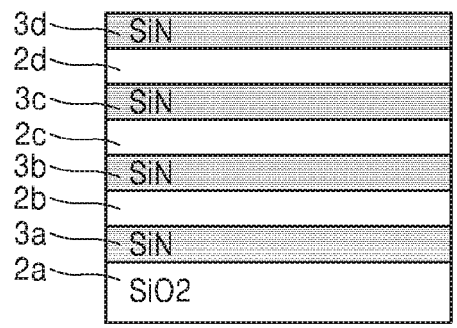
FIGS. 1A, 1B and 1C schematically illustrate a semiconductor manufacturing process in which short circuits could form as contact is made to a stepped structure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described with reference to the accompanying drawings.

The embodiments of the present disclosure are provided to more fully describe the present disclosure to those of ordinary skill in the art, the following embodiments may be modified in various other forms, and the scope of the present disclosure is not limited to the following embodiments. Rather, these embodiments are provided so that this disclosure will be more thorough and complete, and will fully convey the concept of the disclosure to those of ordinary skill in the art.

The terminology used herein is for the purpose of describing particular embodiments only and is not intended to limit the present disclosure. As used herein, the singular forms "a", "an", and "the" may include plural forms unless the context clearly indicates otherwise. Also, when used in this specification, the terms "include (comprise)" and/or "including (comprising)" are taken to specify the presence of the stated shapes, numbers, steps, operations, members, elements, and/or groups thereof and do not preclude the presence or addition of one or more other shapes, numbers, operations, members, elements, and/or groups thereof. As used herein, the term "and/or" may include any and all combinations of one or more of the associated listed items.

Although terms such as "first" and "second" are used herein to describe various members, regions, and/or portions, these members, components, regions, layers, and/or portions are not limited by these terms. These terms are not intended to mean particular orders, priorities, or superiorities, and are used only to distinguish one member, region, or portion from another member, region, or portion. Thus, a first member, region, or portion to be described below may refer to a second member, region, or portion without departing from the teachings of the present disclosure.

In this specification, the x axis, the y axis, and the z axis are not limited to three axes of the rectangular coordinate system, and may be interpreted in a broader sense. For example, the x axis, the y axis, and the z axis may be perpendicular to each other, or may represent different directions that are not perpendicular to each other.

In the present disclosure, "gas" may include evaporated solids and/or liquids and may include a single gas or a mixture of gases. In the present disclosure, the process gas introduced into a reaction chamber through a showerhead may include a precursor gas and an additive gas. The precursor gas and the additive gas may typically be introduced as a mixed gas or may be separately introduced into a reaction space. The precursor gas may be introduced together with a carrier gas such as an inert gas. The additive gas may include a dilution gas such as a reactant gas and an inert gas. The reactant gas and the dilution gas may be mixedly or separately introduced into the reaction space. The precursor may include two or more precursors, and the reactant gas may include two or more reactant gases. The precursor may be a gas that is chemisorbed onto a substrate and typically contains metalloid or metal elements constituting a main structure of a matrix of a dielectric film, and the reactant gas for deposition may be a gas that reacts with the precursor chemisorbed onto the substrate when excited to fix an atomic layer or a monolayer on the substrate. The term "chemisorption" may refer to chemical saturation adsorption. A gas other than the process gas, that is, a gas introduced without passing through the showerhead may be used to seal the reaction space, and it may include a seal gas such as an inert gas. In some embodiments, the term "film" may refer to a layer that extends continuously in a direction perpendicular to a thickness direction without substantially having pinholes to cover an entire target or a relevant surface, or may refer to a layer that simply covers a target or a relevant surface. In some embodiments, the term "layer" may refer to a structure, or a synonym of a film, or a non-film structure having any thickness formed on a surface. The film or layer may include a discrete single film or layer or multiple films or layers having some characteristics, and the boundary between adjacent films or layers may be clear or unclear and may be set based on physical, chemical, and/or some other characteristics, formation processes or sequences, and/or functions or purposes of the adjacent films or layers.

In the present disclosure, the expression "containing a Si—N bond" may be referred to as "having a main skeleton substantially constructed by a Si—N bond or Si—N bonds", "having a substituent substantially constructed by a Si—N bond or Si—N bonds", or "being characterized by a Si—N bond or Si—N bonds". A silicon nitride layer may be a dielectric layer containing a Si—N bond and may include a silicon nitride layer (SiN) and a silicon oxynitride layer (SiON).

In the present disclosure, the expression "same material" should be interpreted as meaning that main constituents are the same. For example, when a first layer and a second layer are both silicon nitride layers and are formed of the same material, the first layer may be selected from the group consisting of Si2N, SiN, Si3N4, and Si2N3 and the second layer may also be selected from the above group but a particular film quality thereof may be different from that of the first layer.

Additionally, in the present disclosure, according as an operable range may be determined based on a regular job, any two variables may constitute an operable range of the variable and any indicated range may include or exclude end points. Additionally, the values of any indicated variables may refer to exact values or approximate values (regardless of whether they are indicated as "about"), may include equivalents, and may refer to an average value, a median value, a representative value, a majority value, or the like.

In the present disclosure where conditions and/or structures are not specified, those of ordinary skill in the art may easily provide these conditions and/or structures as a matter of customary experiment in the light of the present disclosure. In all described embodiments, any component used in an embodiment may be replaced with any equivalent component thereof, including those explicitly, necessarily, or essentially described herein, for intended purposes, and in addition, the present disclosure may be similarly applied to devices and methods.

Hereinafter, embodiments of the present disclosure will be described with reference to the accompanying drawings. In the drawings, variations from the illustrated shapes may be expected as a result of, for example, manufacturing techniques and/or tolerances. Thus, the embodiments of the present disclosure should not be construed as being limited to the particular shapes of regions illustrated herein but may include deviations in shapes that result, for example, from manufacturing processes.

Figure 1B:
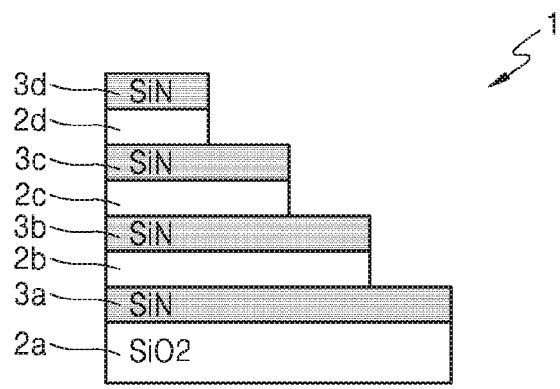
Figure 1C:
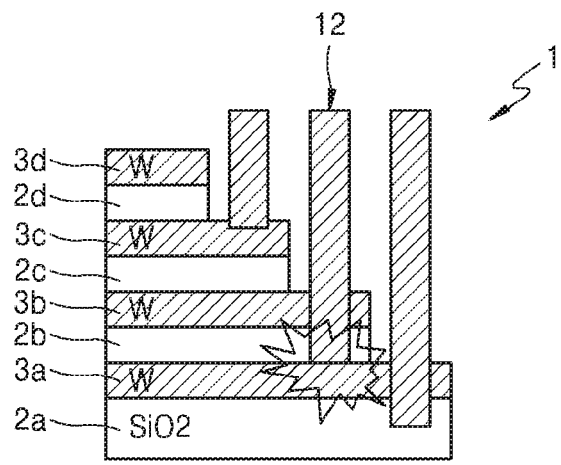

FIGS. 1A, 1B and 1C schematically illustrate a semiconductor device manufacturing process (not necessarily prior art) in which a stepped structure is formed and contacted. As illustrated in FIG. 1A, insulating layers 2a, 2b, 2c, and 2d (hereinafter, collectively referred to as "2") and sacrificial layers 3a, 3b, 3c, and 3d (hereinafter, collectively referred to as "3") are alternately stacked to form a stack structure 1. For example, the insulating layer 2 may be a $SiO_2$ layer, and the sacrificial layer 3 may be a SiN layer. The insulating layer 2 insulates between gate electrodes (not illustrated). Each of the sacrificial layers 3a, 3b, 3c may be connected to a gate electrode and may be replaced with a metal or other conductive layer such as tungsten or aluminum in a subsequent process.

As illustrated in FIG. 1B, a stack structure of an insulating layer 2 and a sacrificial layer 3 includes a stepped structure such that a metal line may be connected to each step. When a via contact hole is formed, the via contact hole may also be connected to another sacrificial layer 3a through a sacrificial layer 3b due to excessive etching. As illustrated in FIG. 1C, when the sacrificial layers 3a-3c are replaced with metal and the via contact holes 12 are filled with metal, an electrical short circuit may occur between the sacrificial layers 3a and 3b, thus disabling normal device operation.

FIGS. 2A, 2B and 2C schematically illustrate a process of depositing and selectively etching a barrier layer on a stepped structure of a three-dimensional (3D) semiconductor device.

In order to minimize the risks of short circuit from the process in FIGS. 1A, 1B and 1C in which a via contact hole passes through a sacrificial layer, an additional SiN layer serving as a landing pad for a via contact hole can be introduced, as illustrated in FIGS. 2A, 2B and 2C.

As illustrated in FIG. 2A, a barrier layer 6 is deposited on a stepped structure 1. The barrier layer 6 may be deposited on a side surface S, an upper surface U, and a lower surface L of each step by using a plasma-enhanced atomic layer deposition (PEALD) process. A plasma process is an in-situ plasma or direct plasma process that is generated on a substrate. The plasma process is an asymmetric, or anisotropic, plasma process. According to the linearity of radical and active species, a barrier layer deposited on horizontal surfaces, such as the upper surface U and the lower surface L, is more densified by the ion-bombardment effect than a barrier layer deposited on vertical surfaces, such as the side surface S. That is, the barrier layer deposited on the upper surface U and the lower surface L has a higher chemical resistance than the barrier layer deposited on the side surface S. Put another way, portions of the barrier layer on the vertical or side surfaces S are more susceptible to subsequent isotropic etching than portions of the barrier layer on horizontal surfaces U and L. The barrier layer 6 may be formed through multi-stage processes while changing process conditions such as plasma power, frequency, or process gas flow rate to improve selective etching and chemical resistance.

As illustrated in FIG. 2B, the barrier layer is then etched by an etching solution (e.g., diluted HF). Due to the linear and anisotropic characteristics of ions during the deposition of the barrier layer in FIG. 2A, in a wet etching process, the barrier layer of the side surface S is removed and despite some etching, at least part of the barrier layer of the upper surface U and the lower surface L of the stepped structure is left (selective etching). Thus, despite using an isotropic etch, such as a wet etch, the sidewall portions of the barrier are selectively removed relative to the horizontal portions on U and L.

Thereafter, via contact holes are formed in the stepped structure 1. Each via contact hole is connected to the barrier layer 6 on a sacrificial layer 3 corresponding thereto. The deposited barrier layer 6 may prevent the via contact hole from passing through the sacrificial layer 3.

In a subsequent process, as illustrated in FIG. 2C, the via contact hole is filled with metal to form a metal line 12. Thereafter, the sacrificial layer 3 and the barrier layer 6 are replaced with a metal, such as tungsten or aluminum, or a conductor, such as a doped insulator or polycrystalline silicon, to form a word line. Accordingly, a gate electrode may be connected to the metal line 12 through a conductive layer 13.

However, the plasma characteristics of the plasma process used during the barrier layer deposition operation depend on the depth from the top to the bottom of the stepped structure, and thus, the wet etching resistance of the barrier layer deposited on the upper surface and the lower surface of the stepped structure varies according to the depth thereof. Accordingly, the thickness of the barrier layer left from the top to the bottom of the stepped structure after the wet etching operation varies according to the depth thereof. This thickness difference will increase as the wet etching time increases. Also, as the number of stack structures (stack height or depth) of the insulating layer and the sacrificial layer increases, the wet etching resistance difference of the barrier layer due to the non-uniform plasma characteristics will become more severe and thus the thickness difference of the barrier layer will become more severe. This may lead to device malfunctions.

Figure 3A:
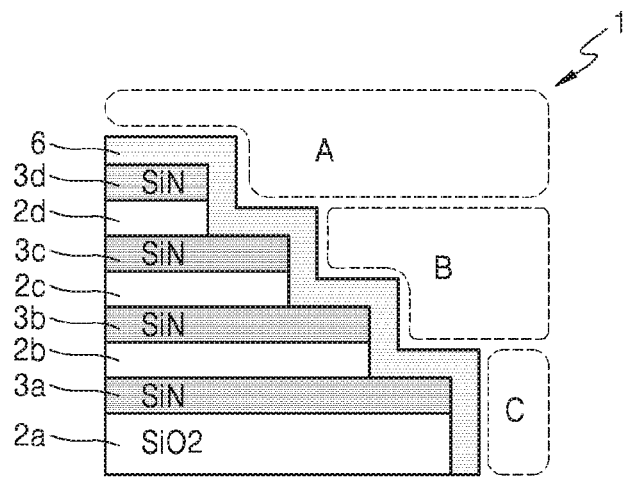
FIGS. 3A and 3B schematically illustrate that a barrier layer deposited on a stepped structure can have different thicknesses due to non-uniform plasma.
Figure 3B:
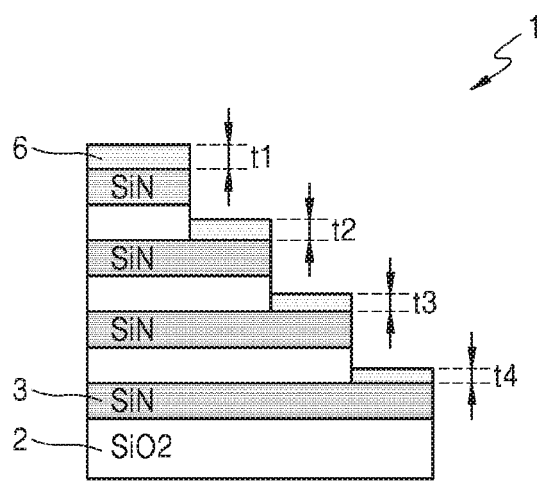

FIGS. 3A and 3B schematically illustrate that a barrier layer 6 deposited on a stepped structure can have different thicknesses due to non-uniform plasma on horizontal surfaces at different depths.

FIG. 3A illustrates an operation of depositing a barrier layer 6 (e.g., a SiN layer) on a stepped structure. In this operation, plasma properties such as plasma density are different according to the depth of the stepped structure. For example, in a capacitively coupled plasma (CCP) plasma process, the plasma properties in a region A, a region B, and a region C are different from each other. Particularly, the plasma density is the greatest in the region A closest to an electrode used in the plasma process, and is the smallest in the region C farthest from the electrode. Accordingly, the barrier layer deposited in the region A becomes denser than the barrier layer deposited in the region C, and the wet etching resistance of the barrier layer deposited in the region A becomes greater than the wet etching resistance of the barrier layer deposited in the region C.

Due to the difference in the wet etching resistance of the barrier layer, after the wet etching operation, thicknesses t1, t2, t3, and t4 of the barrier layer left on each step are different from each other, as illustrated in FIG. 3B. Particularly, the barrier layer deposited in the region A where the wet etching resistance is relatively great is relatively less etched during the wet etching operation, and thus, the thickness of the barrier layer left in the region A is greater than the thickness of the barrier layer left in the regions B and C where the wet etching resistance is relatively small ($\therefore t1 > t2 > t3 > t4$). In this case, there is a need for a method of minimizing or avoiding variable thickness of the barrier layer.

The present disclosure introduces a mask layer on a barrier layer serving as a landing pad to address the foregoing issue. Hereinafter, substrate processing methods according to embodiments of the present disclosure and devices manufactured by the same will be described with reference to FIGS. 4 to 19.

Figure 4:
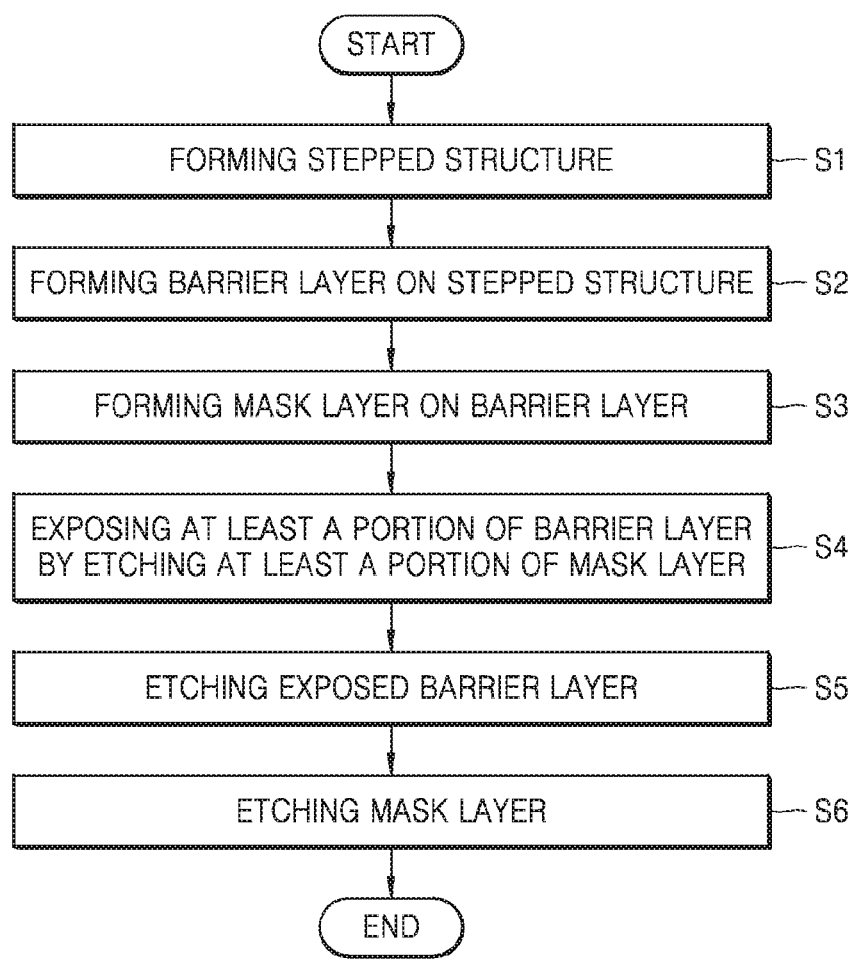
FIG. 4 is a flowchart schematically illustrating a substrate processing method according to embodiments of the present disclosure.

FIG. 4 is a flowchart schematically illustrating a substrate processing method according to embodiments of the present disclosure.

Referring to FIG. 4, first, a stepped structure is formed (operation S1). For example, first, an insulating layer and a sacrificial layer are alternately stacked. Then, the stacked insulating layer and sacrificial layer are etched to form a stepped structure having an upper surface, a lower surface, and a side surface connecting the upper surface and the lower surface.

Thereafter, a barrier layer is formed on the stepped structure (operation S2). The barrier layer may be formed on the upper surface, the lower surface, and the side surface of the stepped structure. The barrier layer may be formed on the stepped structure to cover the stepped structure. The barrier layer may be formed by using an atomic layer deposition (ALD) process, and particularly, by using a PEALD process. In an alternative embodiment, the barrier layer may be formed by sequential PECVD or other methods corresponding thereto. The barrier layer may be an insulating layer. For example, the barrier layer may be a SiN layer. In an embodiment, the barrier layer may be formed as a single layer. In an alternative embodiment, the barrier layer may include a double layer or a composite layer having different chemical resistances that may be formed under different process conditions. The processes of forming the stepped structure and the barrier layer may be performed in-situ in the same reactor or ex-situ in different reactors.

In an alternative embodiment, a plasma post-treatment operation may be performed after operation S2. The plasma post-treatment operation may be performed by using capacitively-coupled plasma (CCP) excited by applying RF power to at least one of the two upper and lower electrodes with a substrate therebetween in a reactor. In an alternative embodiment, the plasma post-treatment operation may be performed in-situ in the same reactor together with the formation of the stepped structure and the barrier layer, or may be performed ex-situ in different reactors.

The plasma post-treatment operation may be performed by using an asymmetric or anisotropic plasma process, and the barrier layer may be selectively densified by the asymmetric plasma process. The asymmetric plasma process may be a concept including a process of applying plasma to provide directionality thereto, and selective densification of a thin film deposited on a stepped structure may be achieved due to the directionality of the plasma.

For example, with respect to a stepped structure having an upper surface, a lower surface, and a side surface connecting the upper surface and the lower surface, the plasma may be applied in a direction parallel to the side surface. In this case, the barrier layer formed on horizontal surfaces, such as the upper surface and the lower surface of the stepped structure, located in a direction perpendicular to the propagation direction of the plasma active species, may be selectively densified due to the directionality of the plasma active species. Accordingly, the wet etching resistance of the barrier layer on the upper surface and the lower surface of the stepped structure may be enhanced more than the wet etching resistance of the barrier layer on the side surface of the stepped structure.

Due to the mask layer formed on the upper surface and the lower surface, as described below with respect to operation S3, and/or due to the difference in the position-by-position film quality of the layer formed by the asymmetric plasma application, during the later isotropic etching process (operation S5) using a second etching solution, the barrier layer formed on the side surface may be etched, while the barrier layer formed on the upper surface and the barrier layer formed on the lower surface may not be substantially etched (see FIG. 7B).

On the other hand, when the asymmetric plasma process on the barrier layer is not performed, since the barrier layer formed on the upper surface and the lower surface is not densified, the barrier layer formed on the upper surface and the lower surface may be excessively etched in the later etching process on the barrier layer (corresponding to operation S5 of FIG. 4) (see FIG. 7A).

Figure 7A:
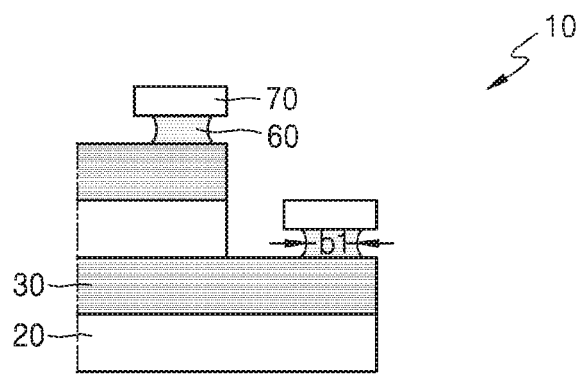
FIG. 7A illustrates the result of applying a substrate processing method according to embodiments of the present disclosure when an asymmetric plasma process is not performed on a barrier layer.
Figure 7B:
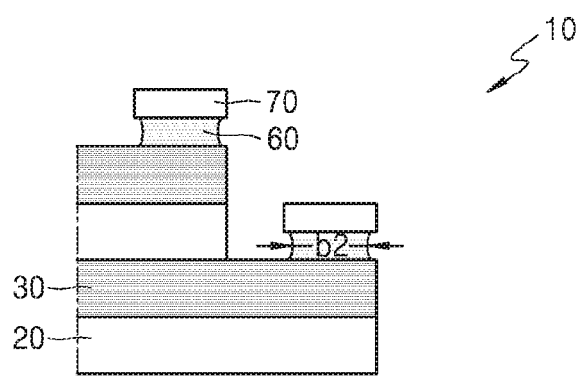
FIG. 7B illustrates the result of applying a substrate processing method according to embodiments of the present disclosure when an asymmetric plasma process is performed on a barrier layer.

FIG. 7A illustrates the result of applying a substrate processing method according to embodiments of the present disclosure when an asymmetric plasma process is not performed on a barrier layer, and FIG. 7B illustrates the result of applying a substrate processing method according to embodiments of the present disclosure when an asymmetric plasma process is performed on a barrier layer. Referring to FIGS. 7A and 7B, a barrier layer 60 formed on an upper surface and a lower surface of a stepped structure 10 of FIG. 7A may be excessively etched by an etchant, while a barrier layer 60 formed on an upper surface and a lower surface of a stepped structure 10 of FIG. 7B may be hardly etched. Particularly, a side-direction width b1 of a center portion of the barrier layer 60 of FIG. 7A is smaller than a side-direction width b2 of a center portion of the barrier layer 60 of FIG. 7B (b1<b2).

As the barrier layer formed on the upper surface and the lower surface is etched more, the barrier layer may not serve as a landing pad in the future. Thus, the asymmetric plasma process may be performed on the barrier layer such that the barrier layer located on the side surface of the stepped structure may be etched by a second etching solution, while the barrier layer located on the upper surface and the lower surface of the stepped structure may be hardly etched and is not removed. Also, an etch rate of the barrier layer located on the upper surface and the lower surface of the stepped structure may be equal to or lower than a predetermined etch rate with respect to the second etching solution such that that the barrier layer located on the upper surface and the lower surface of the stepped structure may be hardly etched by the second etching solution and is not removed.

Referring back to FIG. 4, after operation S2, a mask layer is formed on the barrier layer (operation S3). The mask layer may be formed on the barrier layer to cover the barrier layer. The mask layer may be formed by using at least one of an atomic layer deposition (ALD) process, a PEALD process, a sequential plasma-enhanced chemical vapor deposition (PECVD) process, and a pulsed CVD process. The mask layer may be an insulating layer. For example, the mask layer may be a SiO layer. In this case, an oxygen-containing gas such as $O_2$, $O_3$, $N_2O$, or $NO_2$ may be used as a reactant. The processes of forming the stepped structure and the mask layer may be performed in-situ in the same reactor or ex-situ in different reactors.

In an alternative embodiment, a plasma post-treatment operation may be performed after operation S3. The plasma post-treatment operation may be performed by using CCP excited by applying RF power to at least one of two electrodes with a substrate therebetween in a reactor. In an alternative embodiment, the plasma post-treatment operation may be performed in-situ in the same reactor together with the formation of the stepped structure, the barrier layer, and the mask layer or may be performed ex-situ in different reactors.

The plasma post-treatment operation may be performed by using an asymmetric or anisotropic plasma process, and the mask layer may be selectively densified by the asymmetric plasma process. The asymmetric plasma process may be a concept including a process of applying plasma to provide directionality thereto, and selective densification of a mask layer deposited on a stepped structure may be achieved due to the directionality of the plasma, as described with respect to the barrier layer formation of operation S2.

For example, with respect to a stepped structure having an upper surface, a lower surface, and a side surface connecting the upper surface and the lower surface, the plasma may be applied in a direction parallel to the side surface. In this case, the mask layer formed on horizontal surfaces, such as the upper surface and the lower surface of the stepped structure, located in the direction perpendicular to the propagation direction of the plasma active species, may be selectively densified due to the directionality of the plasma active species. Accordingly, the wet etching resistance of the mask layer on the horizontal surfaces, such as the upper surface and the lower surface of the stepped structure, may be enhanced relative to the wet etching resistance of the mask layer on the vertical surfaces, such as the side surface of the stepped structure.

The wet etching resistance of the mask layer may be changed by changing the process conditions of the asymmetric plasma (e.g., plasma power, frequency, or process gas flow rate).

Due to the difference in the position-by-position film quality of the layer formed by the asymmetric plasma application, the mask layer formed on the upper surface and the mask layer formed on the lower surface may be separated during the later isotropic etching process (operation S4).

Thereafter, a wet etching operation may be performed on the mask layer (operation S4). The mask layer may be removed by this operation, and the removal may be partially performed in a selective region of the mask layer by using an etching solution (selective etching). For example, by performing the wet etching operation, the mask layer formed on the side surface may be removed, while the mask layer formed on the upper surface and the lower surface may be left. As such, the substrate processing method according to embodiments of the present disclosure may selectively form a mask layer on a region of a stepped structure without a separate additional photolithography process. Thus, such a selective mask layer deposition operation may also be referred to as a topological selective (TS) mask layer deposition operation. When at least a portion of the mask layer is etched by wet etching, at least a portion of the barrier layer may be exposed to an etching solution at a position corresponding thereto. Thus, blanket deposition and isotropic etching can result in selective formation of the mask layer on horizontal surfaces.

After the wet etching operation on the mask layer (operation S4), an etching operation may be performed to remove the exposed barrier layer (operation S5). In this case, in order to etch only the exposed barrier layer without etching the mask layer left on the upper surface and the lower surface, the etching resistance of the mask layer may be greater than the etching resistance of the barrier layer with respect to the etching solution used in operation S5. Accordingly, by performing the wet etching operation, the barrier layer formed on the side surface may be removed, while the mask layer and the barrier layer formed on the upper surface and the lower surface may be left. Because the horizontal portions of the barrier layer were densified, relative to the vertical portions, lateral recessing of the horizontal portions of the barrier layer underneath the mask can be resisted despite removal of the vertical portions of the barrier (see FIG. 7B).

Table 1 below shows a wet etch rate (WET) of a $SiO_2$ layer and a SiN layer with respect to phosphoric acid ($H_3PO_4$). According to Table 1, with respect to a $H_3PO_4$ solution, SiN has an about 12.4 times greater wet etch rate than $SiO_2$. Thus, when the barrier layer is a silicon nitride layer and the mask layer is a silicon oxide layer, if operation S5 is performed by using a $H_3PO_4$ solution as an etching solution, the barrier layer exposed on the side surface of the stepped structure may be easily removed, while the mask layer formed on the upper surface and the lower surface may not be substantially etched and is not removed.

TABLE 1

| | $SiO_2$ | SiN | Remark |
|---|---|---|---|
| WER (Å/min) | 10.4 | 129.4 | Etching Condition: Immersed in $H_3PO_4$ at 160° C. for 30 seconds |

As such, by using an etching resistance of a film with respect to a particular chemical, it may be possible to selectively form a barrier layer on a region of a stepped structure without a separate additional photolithography process. Such a selective barrier layer formation operation may also be referred to as a topological selective (TS) barrier layer deposition operation.

Thereafter, in order to use the barrier layer as a landing pad, an operation of etching the mask layer left on the upper surface and the lower surface is performed (operation S6). In this case, in order to etch only the mask layer left on the upper surface and the lower surface without etching the barrier layer left on the upper surface and the lower surface, the etching resistance of the barrier layer may be greater than the etching resistance of the mask layer with respect to the etching solution used in operation S6. Accordingly, by performing operation S6, the left mask layer may be selectively removed, while the barrier layer formed on the upper surface and the lower surface may be left.

In an alternative embodiment, the etching solution used in operation S4 and the etching solution used in operation S6 may be solutions of the same material (e.g., dHF solutions). In this case, the etching solution used in operation S4 and the etching solution used in operation S6 may have different concentrations, or the etching time of operation S4 and the etching time of operation S6 may be different from each other. When an asymmetric plasma post-treatment is performed on the mask layer, since the mask layer formed on the upper surface and the lower surface is further densified, the concentration of the etching solution used in operation S6 may be higher than the concentration of the etching solution used in operation S4. Otherwise, that is, when the concentration of the etching solution used in operation S6 is equal to the concentration of the etching solution used in operation S4, the etching time of operation S6 may be longer than the etching time of operation S4.

Meanwhile, after operation S6 is performed, the thicknesses of the barrier layer left on each step of the stepped structure will be equal to each other. When an asymmetric plasma process is performed on the barrier layer, although the barrier layer left on each step of the stepped structure has different densities due to the depth dependence of the asymmetric plasma process, the thicknesses of the barrier layer left on each step of the stepped structure will be equal to each other. This is because the barrier layer formed on the upper surface and the lower surface is not exposed to the etching solution during operations S3 to S6 and thus is not etched, by forming the mask layer on the barrier layer and performing the selective deposition/etching process. Accordingly, unlike the process of FIGS. 3A and 3B, the process of FIG. 4 minimizes or avoids variability in the thicknesses of the barrier layer on each step of the stepped structure.

Figure 5:
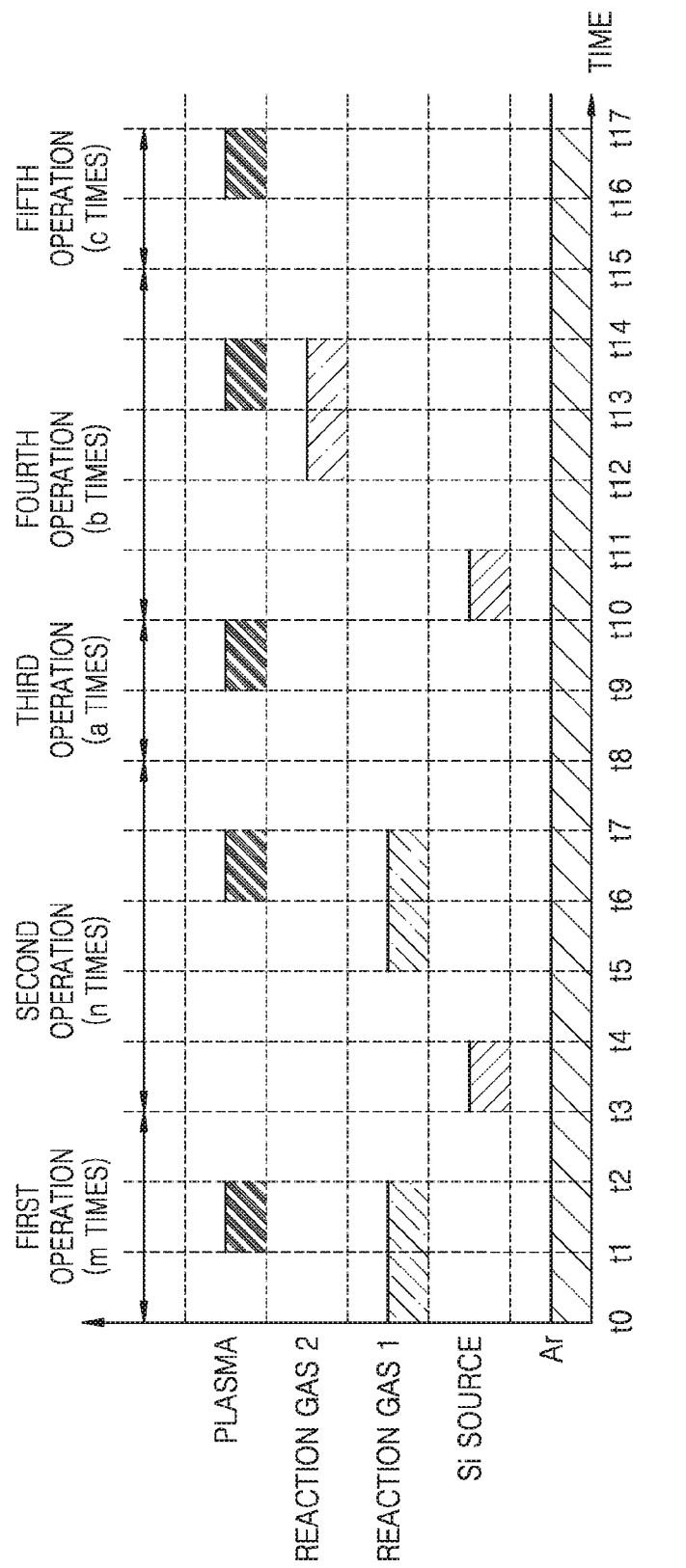
FIG. 5 schematically illustrates a substrate processing method according to embodiments of the present disclosure.

FIG. 5 schematically illustrates a substrate processing method according to embodiments of the present disclosure.

Referring to FIG. 5, a method of maintaining the thickness of a barrier layer on a stepped structure is described. According to the present embodiment, a mask layer is further deposited on a barrier layer to be used as a landing pad.

According to the present embodiment, the method may include a first operation, a second operation, a third operation, a fourth operation, and a fifth operation. The first operation is a plasma pre-treatment operation, the second operation is a barrier layer deposition operation, the third operation is a plasma post-treatment operation, the fourth operation is a mask layer deposition operation, and the fifth operation is a plasma post-treatment operation. In an alternative embodiment, the first operation, the third operation, and the fifth operation may be skipped and/or incorporated into deposition operations.

Particularly, in the first operation, a substrate (stepped structure) is loaded into a reactor and then a plasma pre-treatment is performed on the substrate (stepped structure). The plasma pre-treatment activates a reaction gas by plasma by supplying only the reaction gas without supplying a source gas. During one cycle of the first operation, the reaction gas may be supplied (t0 to t2) and then the plasma may be applied with the reactive gas supplied (t1 to t2). The ion-bombardment effect of the activated reaction gas increases the wet etching resistance of a target film. In this case, the wet etching resistance of the upper and lower portions of the stepped structure may be increased. As such, by performing the plasma pre-treatment on the stepped structure before the barrier layer deposition operation, it may be possible to avoid over-etching the upper and lower portions of the stepped structure during the later etching operation (e.g., operation S5 of FIG. 4). As illustrated in FIG. 5, a cycle of reactive gas supply (t0 to t2)/plasma application (t1 to t2)/purge (t2 to t3) may be repeated a plurality of times (e.g., "m" times) to adjust the density of the stepped structure.

The second operation is an operation of depositing a barrier layer on the substrate (i.e., on the stepped structure). The second operation is a PEALD thin film deposition operation. As illustrated in FIG. 5, a basic PEALD cycle of source supply (t3 to t4)/purge (t4 to t5)/reactant supply (t5 to t7)/RF plasma (t6 to t7)/purge (t7 to t8) may be repeated several times (e.g., "n" times) to form a barrier layer of a desired thickness.

In the present embodiment, the source gas may be a precursor including Si, and more particularly, a precursor including an aminosilane group. A gas including nitrogen may be used as an example of the reactant. For example, the reaction gas may be $N_2$, $NH_3$, or $NH_4^+$. However, the source gas and the reactant used herein are not limited thereto. TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$, or the like may be used as a Si source, or a combination thereof may be used to supply the Si source. In the present disclosure, the reactant may be a nitrogen gas containing hydrogen, and $NH_4^+$ or the like may be used in addition to the above-described ammonia ($NH_3$). Ar may be used as a purge gas.

After the second operation is repeated several times to deposit a barrier layer of a desired thickness, a plasma post-treatment using an Ar gas may be performed during the third operation. During one cycle of the third operation, the Ar gas may be supplied (t8 to t10) and then the plasma may be applied with the Ar gas supplied (t9 to t10). This cycle may be performed a plurality of times (e.g., "a" times). During the third operation, the ion-bombardment effect by Ar ions in the plasma may be achieved.

In an alternative embodiment, the plasma post-treatment operation may be performed by using an asymmetric or anisotropic plasma process. For example, with respect to a stepped structure having an upper surface, a lower surface, and a side surface connecting the upper surface and the lower surface, the plasma may be applied in a direction parallel to the side surface. In this case, since the Ar ion has directivity (linearity), the ion-bombardment effect of the barrier layer formed on the upper surface and the lower surface of the step structure (e.g., the stepped structure) is great and the ion-bombardment effect of the barrier layer formed on the side surface is small. Thus, the barrier layer deposited on the sidewall by the plasma post-treatment is less dense than the barrier layer formed on the upper and lower portions of the stepped structure, and the WER thereof becomes relatively high.

The fourth operation is an operation of depositing a mask layer on the barrier layer. The fourth operation is a PEALD thin film deposition operation. As illustrated in FIG. 5, a basic PEALD cycle of source supply (t10 to t11)/purge (t11 to t12)/reactant supply (t12 to t14)/RF plasma (t13 to t14)/purge (t14 to t15) may be repeated several times (e.g., "b" times) to form a mask layer of a desired thickness.

In the present embodiment, the source gas may be a precursor including Si, and more particularly, a precursor including an aminosilane group. A gas including oxygen may be used as an example of the reactant. For example, the reaction gas may be $O_2$, $O_3$, $N_2O$, or $NO_2$. However, the source gas and the reactant used herein are not limited thereto.

After the fourth operation is repeated several times to deposit a mask layer of a desired thickness, a plasma post-treatment using an Ar gas may be performed during the fifth operation. During one cycle of the fifth operation, the Ar gas may be supplied (t15 to t17) and then the plasma may be applied with the Ar gas supplied (t16 to t17). This cycle may be performed a plurality of times (e.g., "c" times). During the fifth operation, the ion-bombardment effect by Ar ions in the plasma may be achieved.

In alternative embodiment, the process conditions (e.g., plasma power, frequency, or process gas flow rate) of the asymmetric plasma on the mask layer may be different from the process conditions of the asymmetric plasma on the barrier layer.

As such, according to embodiments of the present disclosure, a mask layer deposition operation may be performed such that portions of the barrier layer formed on the upper surface and the lower surface may be protected from a subsequent etching process and the thickness thereof may be maintained. Accordingly, it may be possible to minimize or avoid variation in the thicknesses of the barrier layer on each step of the stepped structure in the subsequent etching process due to the density difference in the barrier layer formed on each step of the stepped structure.

FIGS. 6A, 6B, 6C, 6D, 6E, 6F, 6G to 6H illustrate the result of applying a substrate processing method according to embodiments of the present disclosure to a pattern of a stepped structure.

Figure 6A:
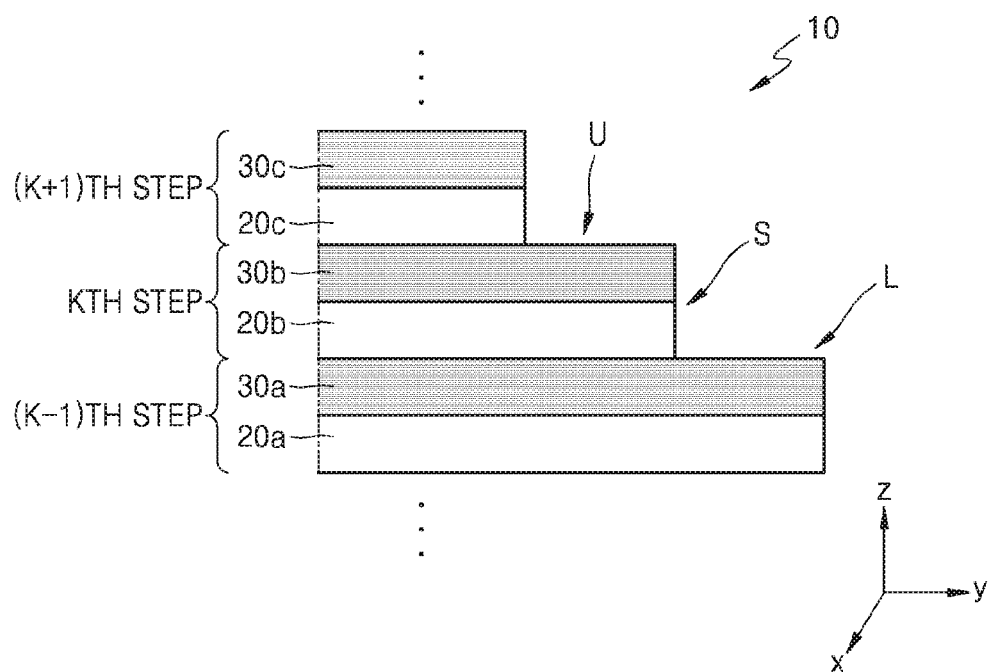
FIGS. 6A, 6B, 6C, 6D, 6E, 6F, 6G and 6H illustrate the result of applying a substrate processing method according to embodiments of the present disclosure to a pattern of a stepped structure.

As illustrated in FIG. 6A, a stepped structure may be a stepped structure 10 in which insulating layers 20a, 20b, and 20c (hereinafter, collectively referred to as "20") and sacrificial layers 30a, 30b, and 30c (hereinafter, collectively referred to as "30") are alternately stacked in the first direction (e.g., the z-axis direction). The stepped structure 10 may be formed by stacking n (n: a natural number greater than or equal to 2) insulating layers 20 and n sacrificial layers 30 alternately a plurality of times and then staircase-etching the stacked insulating layers 20 and sacrificial layers 30 (corresponding to operation S1 of FIG. 4). In this case, the stepped structure may be an n-story stepped structure. Each step of the stepped structure may include an insulating layer 20 formed at a lower portion thereof and a sacrificial layer 30 formed on the insulating layer 20. The stepped structure 10 has an upper surface U, a lower surface L, and a side surface S connecting the upper surface U and the lower surface L.

In an alternative embodiment, the insulating layer 20 may be a silicon oxide layer ($SiO_2$), and the sacrificial layer 30 may be a silicon nitride layer (SiN).

Figure 6B:
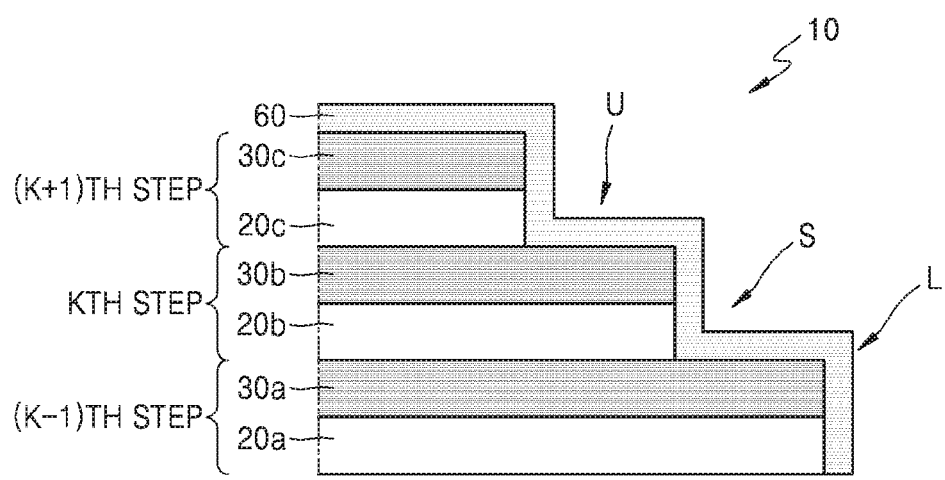

Referring to FIG. 6B, a barrier layer 60 is deposited on the stepped structure 10 (corresponding to operation S2 of FIG. 4). The barrier layer 60 may be formed by using an atomic layer deposition (ALD) process, and particularly, by using a PEALD process.

The barrier layer 60 may be a layer of the same material as the sacrificial layer 30. For example, when the sacrificial layer 30 is a silicon nitride layer, the barrier layer 60 may also be a silicon nitride layer.

Figure 6C:
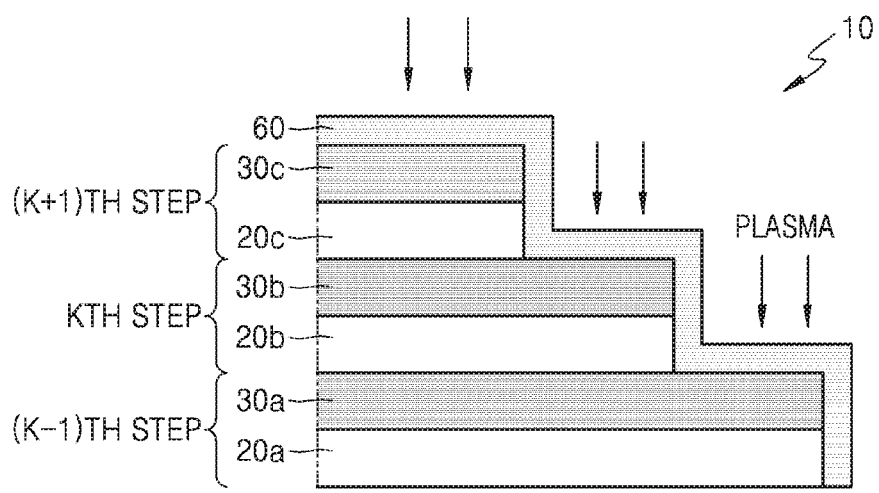

Thereafter, as illustrated in FIG. 6C, a plasma post-treatment operation may be performed on the barrier layer 60. The plasma post-treatment operation may be performed by using CCP excited by applying RF power to at least one of two electrodes with a substrate therebetween in a reactor. In an embodiment, the plasma post-treatment operation may be performed in-situ in the same reactor together with the formation of the insulating layer 20 and the sacrificial layer 30, or may be performed ex-situ in different reactors.

In an embodiment, the plasma post-treatment operation may include selectively densifying at least a portion of the barrier layer located on the upper surface and the lower surface. Particularly, as described above with reference to FIGS. 7A and 7B, since the mask layer is selectively etched and then the barrier layer is exposed to the etching solution, the barrier layer located on the upper surface and the lower surface may be selectively densified and prevented from being etched.

In another embodiment, a gas including the constituents of the barrier layer may be used during the asymmetric plasma process. For example, when the barrier layer is a silicon nitride layer, a gas (e.g., nitrogen) including the constituents of the barrier layer may be activated to generate active species during the asymmetric plasma process. Due to the directionality of nitrogen plasma, the nitrogen plasma may be applied to the barrier layer (silicon nitride layer) formed on the upper surface and the lower surface of the stepped structure. Thus, the nitrogen component as the constituent of the barrier layer may increase and thus a nitrogen-rich silicon nitride layer may be formed.

In the illustrated embodiment, the plasma may be applied to the stepped structure 10 in a direction parallel to the side surface S. In this case, due to the directivity (linearity) of Ar ions, the film quality of the barrier layer 60 formed on horizontal surfaces, such as the upper surface U and the lower surface L, may be different from the film quality of the barrier layer 60 formed on vertical surfaces, such as the side surface S. That is, since the ion-bombardment effect is concentrated on the upper surface U and the lower surface L and the ion-bombardment effect is relatively small on the barrier layer formed on the side surface S, the position-by-position film qualities may be different from each other. Accordingly, the wet etching resistance of the barrier layer 60 formed on the upper surface U and the lower surface L may be increased and the barrier layer 60 on the side surface S may be first etched during the subsequent wet etching operation.

In this case, as described above, since the plasma characteristic depends on the depth thereof, the film quality of the barrier layer 60 formed on the upper surface U and the lower surface L of the stepped structure may vary according to the depth thereof. For example, the barrier layer 60 formed on the first layer of the stepped structure 10 receives less ion-bombardment effect than the barrier layer 60 formed on the nth step of the stepped structure 10, the density of the barrier layer 60 formed on the first step of the stepped structure 10 will be lower than the density of the barrier layer 60 formed on the nth layer of the stepped structure 10. As such, after the plasma post-treatment operation on the barrier layer 60, the barrier layer 60 formed on each step of the stepped structure 10 may have different densities.

Figure 6D:
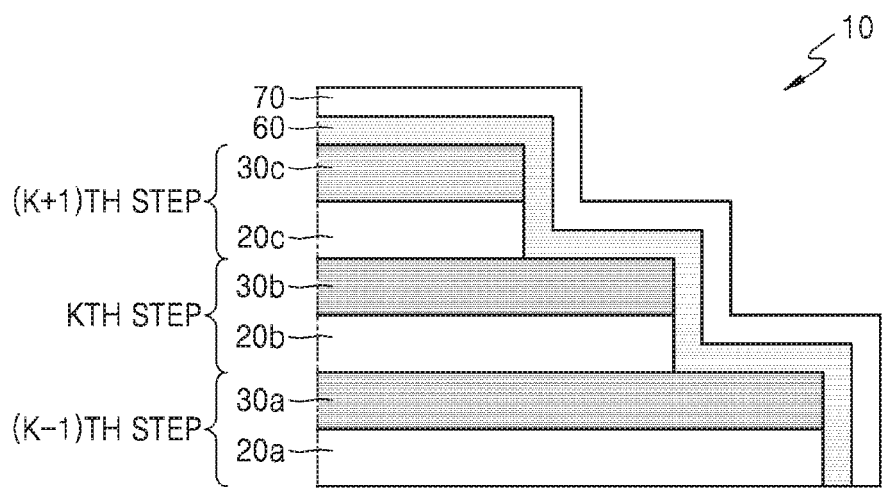

Next, referring to FIG. 6D, a mask layer 70 is formed on the barrier layer 60 (corresponding to operation S3 of FIG. 4). The mask layer 70 may be formed by using an ALD process, and particularly, by using a PEALD process. The mask layer 70 may be a layer of the same material as the insulating layer 20. For example, when the insulating layer 20 is a silicon oxide layer, the mask layer 70 may also be a silicon oxide layer. The processes of forming the barrier layer 60 and the mask layer 70 may be performed in-situ in the same reactor or ex-situ in different reactors.

Figure 6E:
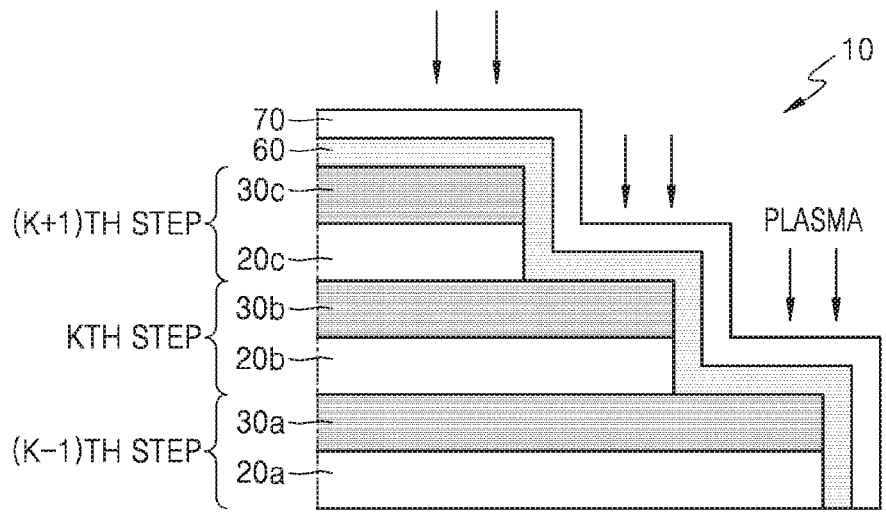

Thereafter, as illustrated in FIG. 6E, a plasma post-treatment operation may be performed thereon. In the present embodiment, the plasma may be applied to the stepped structure 10 in a direction parallel to the side surface S. In this case, due to the directivity (linearity) of Ar ions, the film quality of the mask layer 70 formed on horizontal surfaces, such as the upper surface U and the lower surface L, may be different from the film quality of the mask layer 70 formed on vertical surfaces, such as the side surface S. That is, since the ion-bombardment effect is concentrated on the upper surface U and the lower surface L and the ion-bombardment effect is relatively small on the mask layer 70 formed on the side surface S, the position-by-position film qualities may be different from each other. Accordingly, the wet etching resistance of the mask layer 70 formed on the upper surface U and the lower surface L may be increased and the mask layer 70 on the side surface S may be first etched during the subsequent wet etching operation.

Figure 6F:
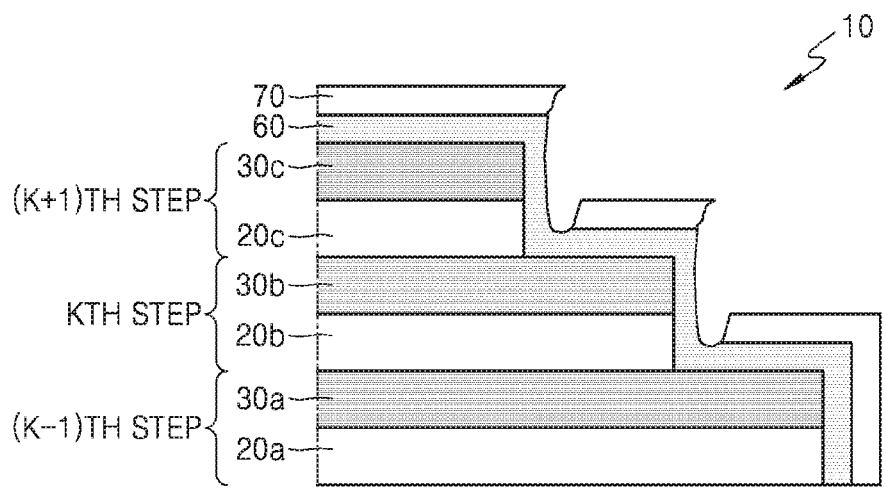

Then, by using the first etching solution, at least a portion of the mask layer 70 is etched to expose at least a portion of the barrier layer 60 (corresponding to operation S4 of FIG. 4). More particularly, as illustrated in FIG. 6F, a portion of the mask layer 70 that is not densified during the asymmetric plasma post-treatment operation, that is, the mask layer 70 formed on the side surface S may be etched and thus the barrier layer 60 located on the side surface S may be exposed. In this case, the mask layer 70 on the upper surface U and the lower surface L will be left.

In an alternative embodiment, when the mask layer 70 is a silicon oxide layer, the first etching solution may be a diluted HF (dHF) solution. The concentration of the dHF solution may be, for example, HF:DIW=1:100.

Figure 6G:
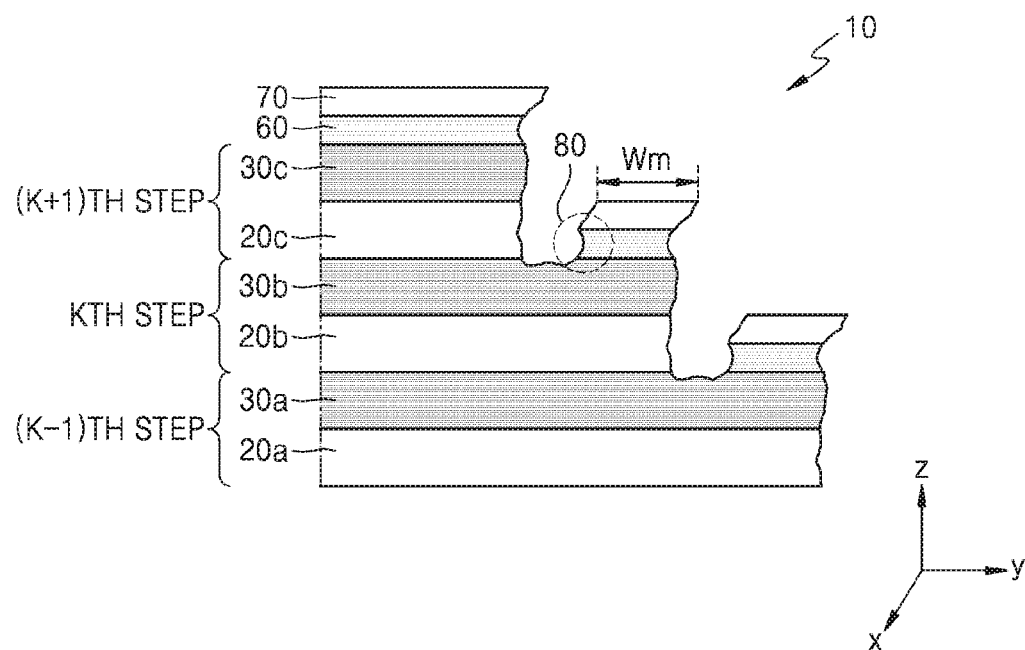

Thereafter, the exposed barrier layer is etched by using the second etching solution (corresponding to operation S5 of FIG. 4). More particularly, as illustrated in FIG. 6G, an exposed portion of the barrier layer 60, that is, the barrier layer 60 formed on the side surface S may be etched by using the mask layer 70 as an etch mask. In this case, the barrier layer 60 on the upper surface U and the lower surface L will be left because it is not exposed to the second etching solution due to the mask layer 70.

In an alternative embodiment, when the barrier layer 60 is a silicon nitride layer, the second etching solution may be a $H_3PO_4$ solution.

Meanwhile, since a process of etching the barrier layer 60 is an isotropic etching process using the mask layer 70 as an etch mask, the sidewalls of the barrier layer 60 on the upper surface U and the lower surface L may be recessed in a horizontal direction parallel to the lower surface of the mask layer 70, in comparison with the above sidewall (see 80 of FIG. 6G). Accordingly, the barrier layer 60 left on the upper surface and the lower surface will have a width smaller than a width Wm of the mask layer 70 left on the upper surface and the lower surface. More details thereof will be described below with reference to FIG. 6H.

In an embodiment, as described above with reference to FIG. 5, when a plasma pre-treatment is performed on the stepped structure 10 before the deposition of the barrier layer 60, the upper surface U and the lower surface L of the stepped structure may be densified. Accordingly, the sacrificial layer 30 of the stepped structure 10 may not be over-etched during the etching of the barrier layer 60.

Then, the remaining portions of the mask layer are etched by using a third etching solution (corresponding to operation S6 of FIG. 4). Particularly, the densified mask layer, that is, the mask layer 70 on the upper surface U and the lower surface L is etched by using the third etching solution.

In an embodiment, when the mask layer 70 is a silicon oxide layer, the third etching solution may be a diluted HF (dHF) solution. In an additional embodiment, since the mask layer 70 on the upper surface U and the lower surface L has a higher wet etching resistance than the mask layer 70 on the side surface S, the third etching solution may be a dHF solution having a higher concentration than the first etching solution. For example, when the first etching solution is a dHF solution having a concentration of, for example, HF:DIW=1:100, the third etching solution may be a dHF solution having a concentration of HF:DIW>1:100. In another additional embodiment, the first etching solution and the third etching solution may be etching solutions of the same concentration, and in this case, the etching time of an etching process using the third etching solution (i.e., operation S6 of FIG. 4) may be longer than the etching time of an etching process using the first etching solution (i.e., operation S4 of FIG. 4).

Figure 6H:
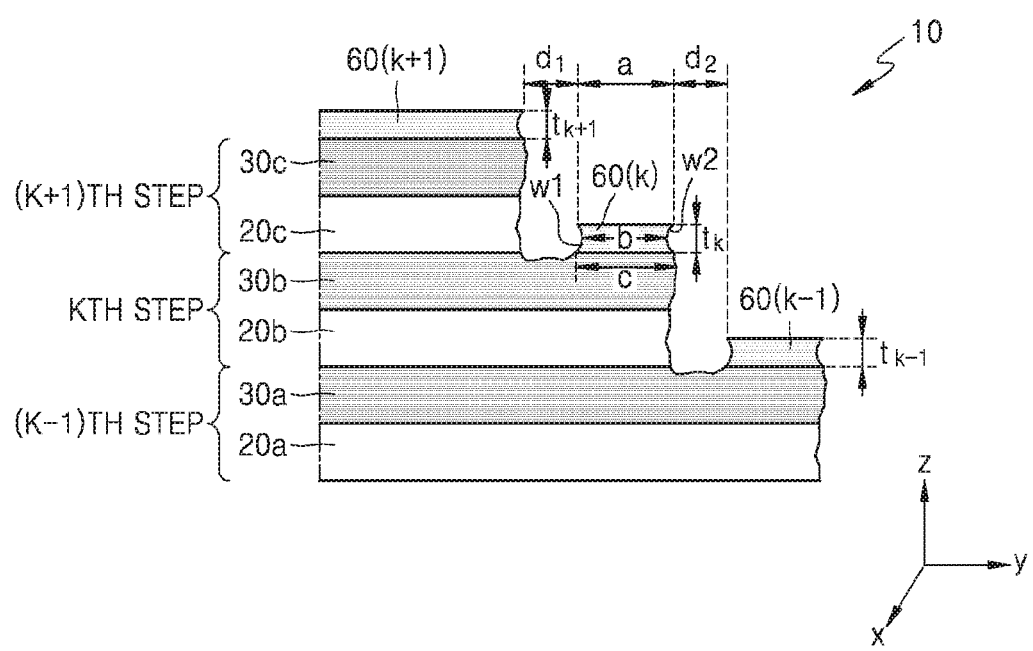

When the operation of etching the remaining portions of the mask layer by using the third etching solution (corresponding to operation S6 of FIG. 4) is performed, the stepped structure has only the barrier layer 60 left on the upper surface and the lower surface, as illustrated in FIG. 6H.

As described above, since the operation of etching the barrier layer 60 (corresponding to operation S5 of FIG. 4) is an isotropic etching process, the sidewalls of the barrier layer 60 on the upper surface U and the lower surface L may be recessed due to the mask layer 70.

Particularly, after operation S5 of FIG. 4 is performed, a barrier layer 60(k) formed on the sacrificial layer 30b forming the kth step (k: a natural number greater than or equal to 2 and smaller than or equal to n) of the stepped structure may include a first sidewall w1 facing one side of the sacrificial layer 30c forming the (k+1)th step of the stepped structure, and a second sidewall w2 facing the first sidewall w1. Due to the isotropic process described above, each of the first sidewall w1 and the second sidewall w2 of the barrier layer 60(k) may have a portion recessed in the side direction (e.g., the y-axis direction) parallel to the upper surface of the barrier layer 60(k). The recessed portion may have a round shape or a shape having a predetermined curvature. Also, a side-direction (e.g., y-axis direction) width "b" of the center portion of the barrier layer 60(k) may be smaller than a side-direction width "a" of the upper surface and a side-direction width "c" of the lower surface of the barrier layer 60(k). The recessed portion of the first sidewall w1 and the second sidewall w2 may extend in the second direction (e.g., the x-axis direction).

Thus, when a conductive word line structure is formed corresponding to a space from which the sacrificial layer 30 and the barrier layer 60 are removed, each of both sidewalls of a second conductive layer (corresponding to the barrier layer 60) of the conductive word line structure, and the side-direction width of a center portion of the second conductive layer may be smaller than the side-direction width of an upper surface and a lower surface of the second conductive layer.

Also, as described above, since the barrier layer formed on the upper surface and the lower surface is not exposed to the etching solution during operations S3 to S6 of FIG. 4, the thickness of the barrier layer located on the upper surface and the lower surface of the stepped structure may be uniform. Accordingly, the barrier layer formed on each step of the stepped structure may have the same thickness in the first direction (e.g., the z-axis direction). For example, in FIG. 6H, the barrier layers formed on the (k−1)th step to the (k+1)th step may have the same thickness (i.e., $t_{k-1}=t_k=t_{k+1}$). Even when the number of stack structures of the insulating layers and the sacrificial layers increases, that is, even when "n" increases, the barrier layer formed on each step according to embodiments of the present disclosure may have the same thickness.

However, according to an alternative embodiment, when an asymmetric plasma process is performed on the barrier layer (corresponding to the third operation of FIG. 5), the barrier layer formed on each step of the stepped structure may have different densities due to the depth-dependence of the asymmetric plasma process. For example, a barrier layer 60(k+1) formed on the (k+1)th step and a barrier layer 60(k−1) formed on the (k−1)th step may have different densities.

Also, the barrier layers formed on the respective steps of the stepped structure may be spaced apart from each other in the third direction (e.g., the y-axis direction). For example, referring to FIG. 6H, the barrier layer 60(k+1) formed on the (k+1)th step and the barrier layer 60(k) formed on the kth step may be spaced apart from each other in the y-axis direction and a distance therebetween may be $d_1$. Also, the barrier layer 60(k) formed on the kth step and the barrier layer 60(k−1) formed on the (k−1)th step may be spaced apart from each other in the y-axis direction and a distance therebetween may be $d_2$. The distances $d_1$ and $d_2$ may be equal to each other.

Figure 6I:
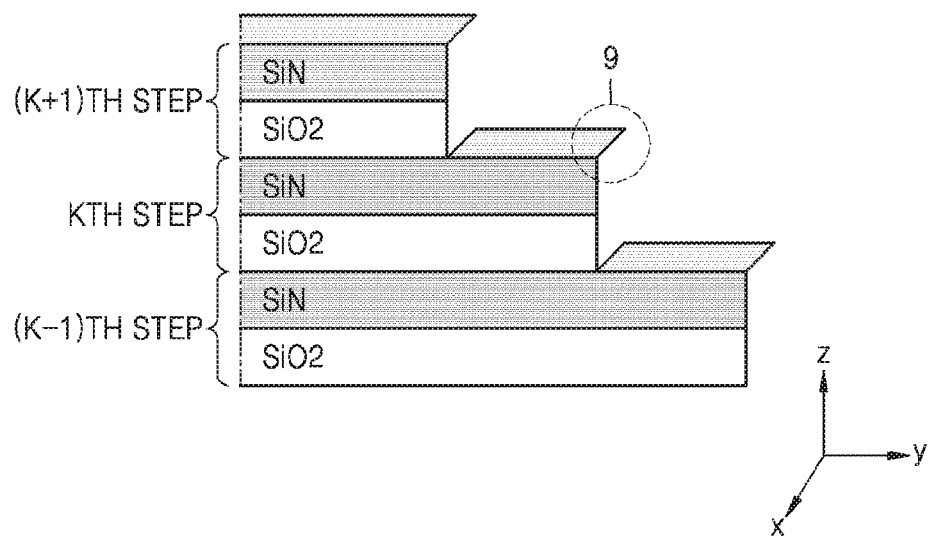
FIG. 6I illustrates a method of depositing a barrier layer for use as a landing pad.
Figure 6J:
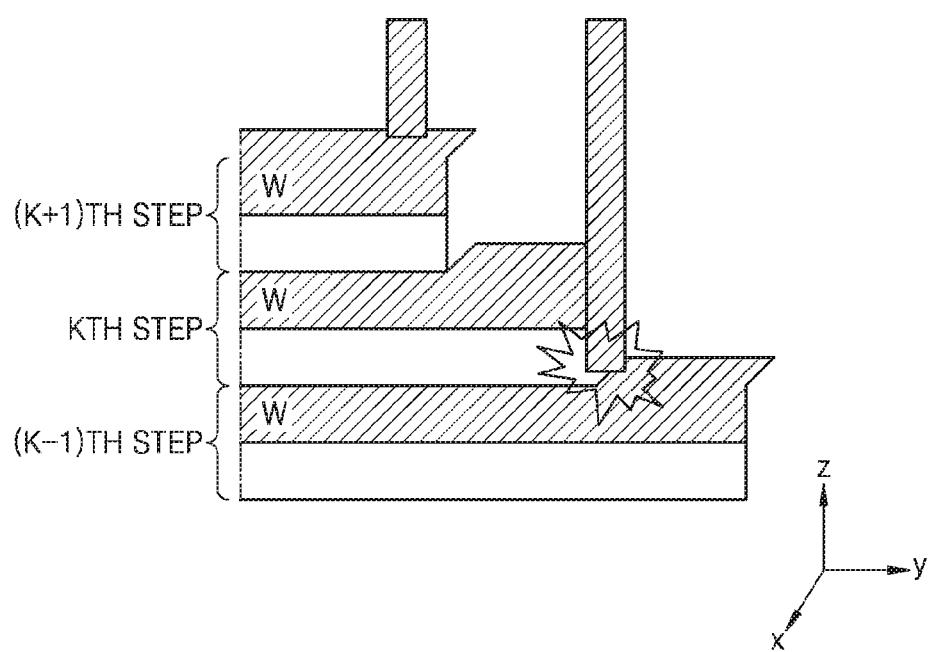
FIG. 6J illustrates that when a via contact hole is formed afterward, the via contact hole may be connected through the barrier layer on the kth step to the barrier layer on the (k−1)th step due to excessive etching.

In a related-art technique (not necessarily prior art) of depositing a barrier layer for use as a landing pad, as illustrated in FIG. 6I, since the density of a barrier layer on the interface between the upper surface U and the side surface S and a barrier layer on the interface between the lower surface L and the side surface S is between the density of a barrier layer deposited on the upper surface U and the density of a barrier layer deposited on the side surface, after wet etching is performed on the barrier layer, a partially-left inclined protrusion (overhang) 9 is left (see Korean Patent Application No. 10-2017-0084986). Accordingly, the barrier layers left on the respective steps are not spaced apart from each other in the y-axis direction. That is, the barrier layers left on the respective steps may be arranged overlapping each other in the z-axis direction. Accordingly, as illustrated in FIG. 6J, when a via contact hole is formed afterward, the via contact hole may be connected through the barrier layer on the kth step to the barrier layer on the (k−1)th step due to excessive etching.

However, according to embodiments of the present disclosure, since the barrier layers formed on the respective steps may be spaced apart from each other, when a via contact hole is formed afterward, the via contact hole may be prevented from being connected through a barrier layer (e.g., 60(*k*)) to another barrier layer (e.g., 60(*k*−1)) due to excessive etching.

FIGS. 8, 9, 10, 11, 12, 13, 14, 15, 16, 17 and 18 schematically illustrate a substrate processing method according to embodiments of the present disclosure.

Figure 8:
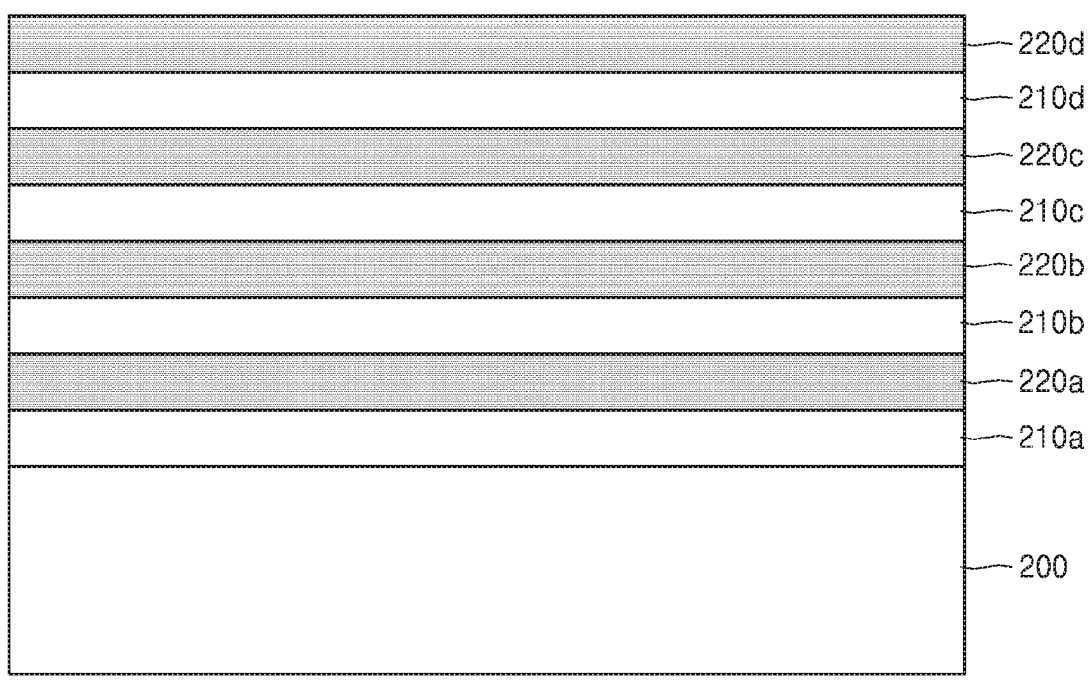
FIGS. 8, 9, 10, 11, 12, 13, 14, 15, 16, 17 and 18 schematically illustrate a substrate processing method according to embodiments of the present disclosure.

Referring to FIG. 8, a stack structure including first insulating layers 210*a*, 210*b*, 210*c*, and 210*d* (hereinafter, collectively referred to as "210") and first sacrificial layers 220*a*, 220*b*, 220*c*, and 220*d* (hereinafter, collectively referred to as "220") is alternately stacked a plurality of times on a substrate 200. For example, the first insulating layer 210 may be a first silicon oxide layer, and the first sacrificial layer 220 may be a first silicon nitride layer. However, the present disclosure is not limited thereto, and the first insulating layer 210 and the first sacrificial layer 220 may be formed of any materials having different etch selectivities.

Thereafter, the first insulating layer 210 and the first sacrificial layer 220 are etched to form channel holes, and a process for forming at least some of the components of a memory cell string (MCS of FIG. 19) into the channel holes is performed. The memory cell string may include components such as a channel, a gate conductive layer, and a gate insulating layer.

The process for forming the components of the memory cell string may be performed by directly forming at least some of a channel, a gate conductive layer, and a gate insulating layer, may be performed by forming a sacrificial layer into a channel hole such that a channel, a gate conductive layer, and a gate insulating layer may be formed in a subsequent process, or may be performed by a combination thereof.

Figure 9:
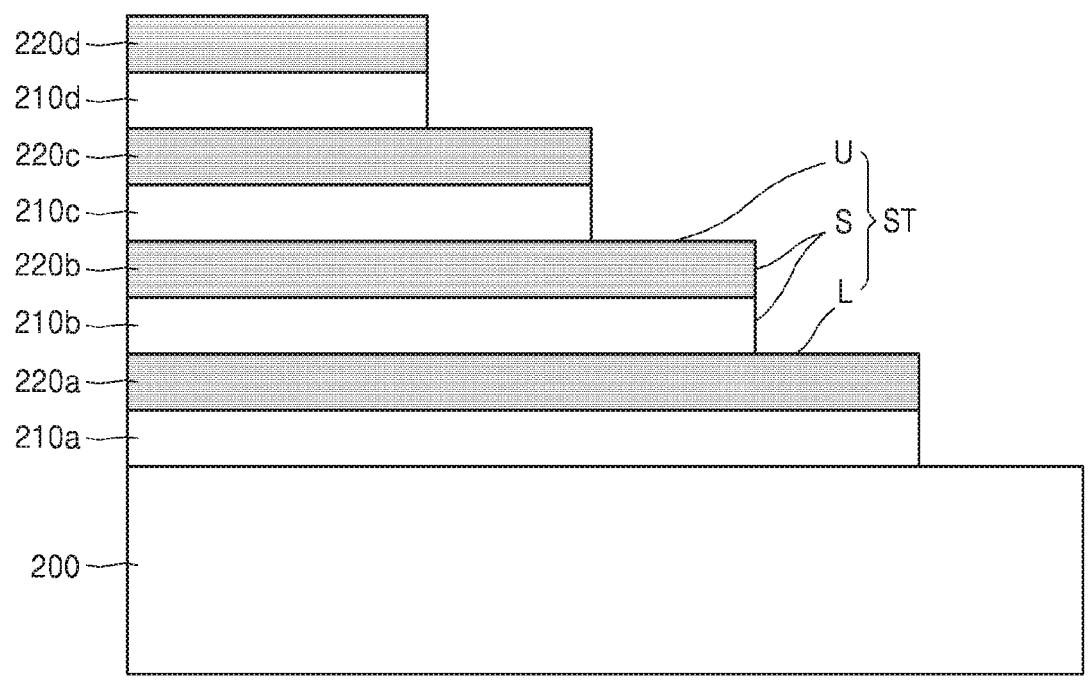

Then, the stack structure is etched to form a stepped structure having an upper surface, a lower surface, and a side surface connecting the upper surface and the lower surface. For example, as illustrated in FIG. 9, one end of the stacked structure including the first insulating layer 210 and the first sacrificial layer 220 is etched to form a stepped structure. The stepped structure may be formed by, for example, reactive ion etching and resist slimming.

Since the stepped structure is formed in the shape of a step, the stepped structure has an upper surface, a lower surface, and a side connecting the upper surface and the lower surface. For example, the stepped structure may include at least one step ST, and one step ST may include an upper surface U on the first sacrificial layer 220*b*, a lower surface L on the first sacrificial layer 220*a*, and a side surface S connecting the upper surface U and the lower surface L.

Figure 10:
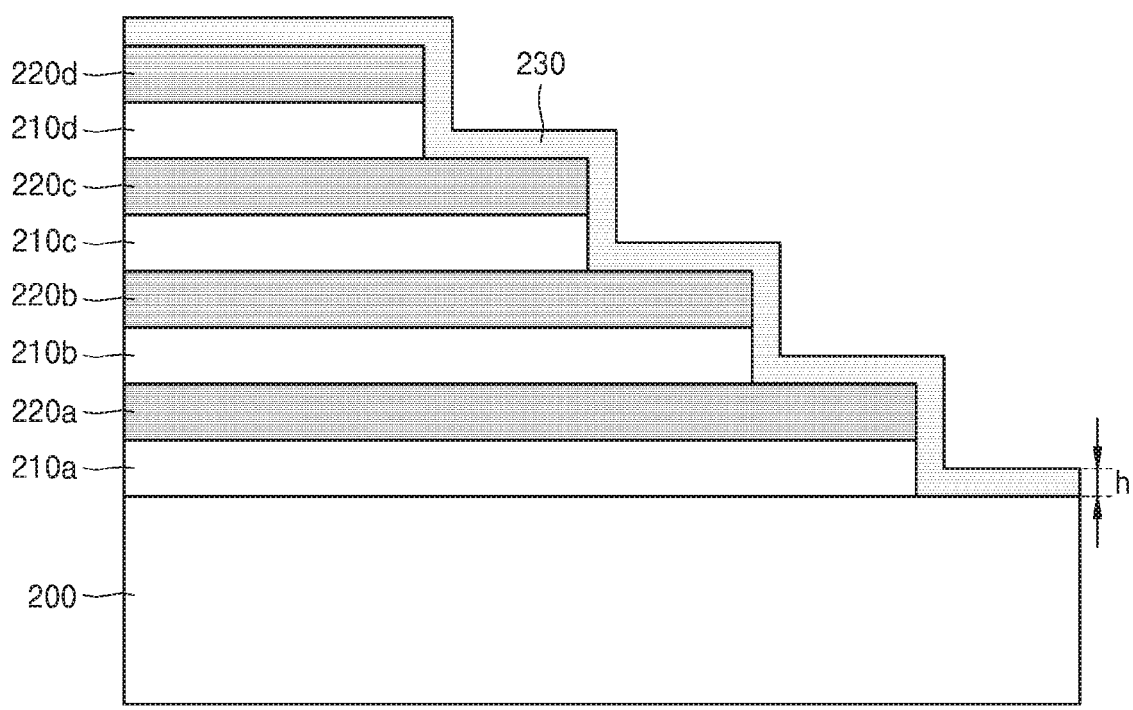

Referring to FIG. 10, at least one layer is formed on the stepped structure. The at least one layer may be an insulating layer, and the insulating layer may be formed through the PEALD process according to the above embodiments. In this case, a second sacrificial layer 230 may be formed on the stepped structure.

In an embodiment, the first sacrificial layer 220 and the second sacrificial layer 230 may be layers of the same material. For example, when the first sacrificial layer 220 is a silicon nitride layer, the second sacrificial layer 230 may also be a silicon nitride layer (i.e., a second silicon nitride layer).

Thereafter, a process of densifying the second sacrificial layer 230, that is, a plasma post-treatment operation may be performed. The plasma post-treatment operation may be performed by using an inert gas such as argon and/or a gas including the constituent of the second sacrificial layer (e.g., nitrogen when the second sacrificial layer 230 is a silicon nitride layer).

The plasma post-treatment operation may be performed by using an asymmetric plasma process. Due to the directionality of the plasma ions of the asymmetric plasma process, only the portions of the second sacrificial layer 230 formed on the upper surface U and the lower surface L of the step may be densified.

Figure 11:
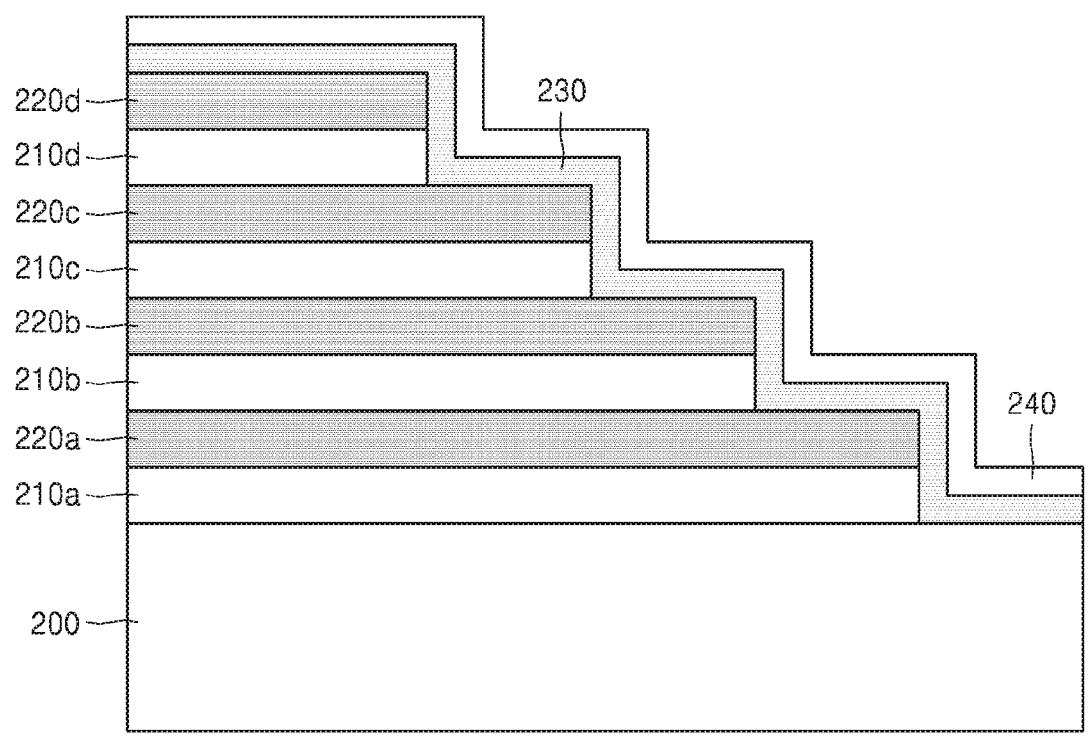

Next, referring to FIG. 11, another layer is formed on the second sacrificial layer 230. The other layer may be an insulating layer and may be formed through the PEALD process according to the above embodiments. In this case, a second insulating layer 240 may be formed on the second sacrificial layer 230.

In an embodiment, the first insulating layer 210 and the second insulating layer 240 may be layers of the same material. For example, when the first insulating layer 210 is a first silicon oxide layer, the second insulating layer 240 may be a second silicon oxide layer.

Thereafter, a process of densifying the second insulating layer 240, that is, a plasma post-treatment operation may be performed. The plasma post-treatment operation may be performed by using an inert gas such as argon and/or a gas including the constituent of the second insulating layer.

The plasma post-treatment operation may be performed by using an asymmetric plasma process. Due to the directionality of the plasma ions of the asymmetric plasma process, only the portions of the second insulating layer 240 formed on the upper surface U and the lower surface L of the stepped structure may be densified.

Figure 12:
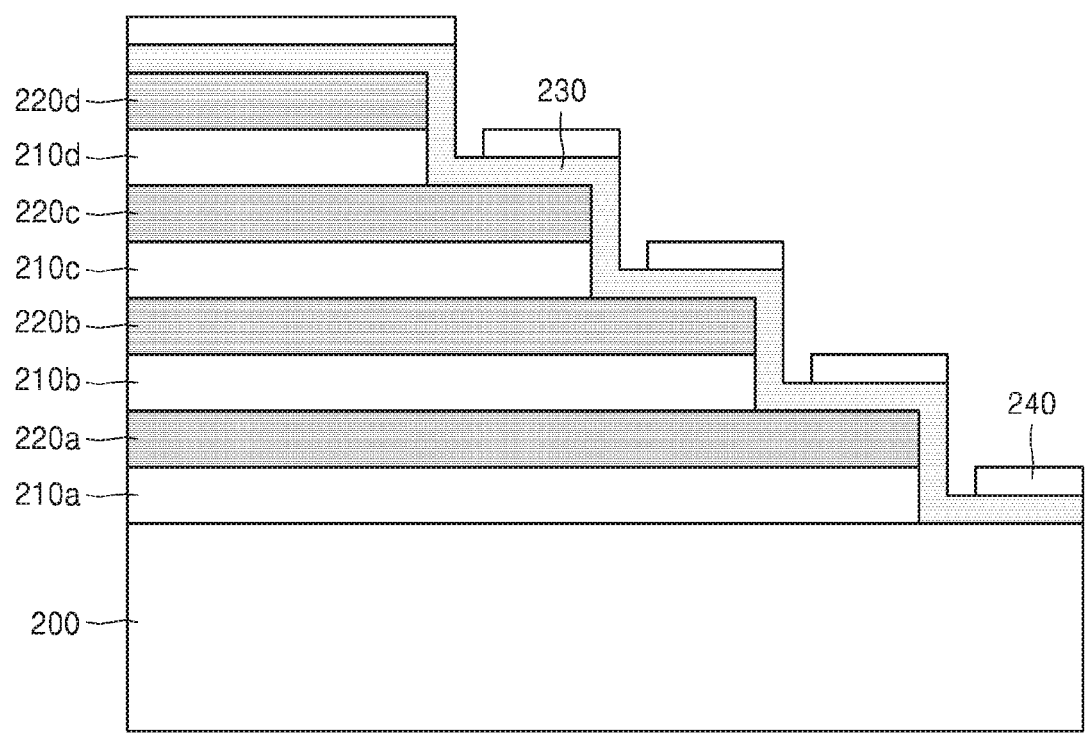

Referring to FIG. 12, an operation of etching at least a portion of the second insulating layer 240 is performed. The etching may be isotropic etching. More particularly, the etching operation may be performed by using a wet etching process and may be performed by using, for example, phosphoric acid or hydrofluoric acid.

Due to the asymmetric plasma post-treatment process, during the etching operation, the etch rate on the second insulating layer 240 on the side surface S of one step is higher than the etch rate on the second insulating layer 240 on the upper surface U and the lower surface L of the step. Thus, only the second insulating layer 240 on the side surface S may be removed, and the second insulating layer 240 on the upper surface U and the lower surface L may be left. As such, only the portion of the second insulation layer 240 that is not densified during the asymmetric plasma post-treatment process may be removed.

Figure 13:
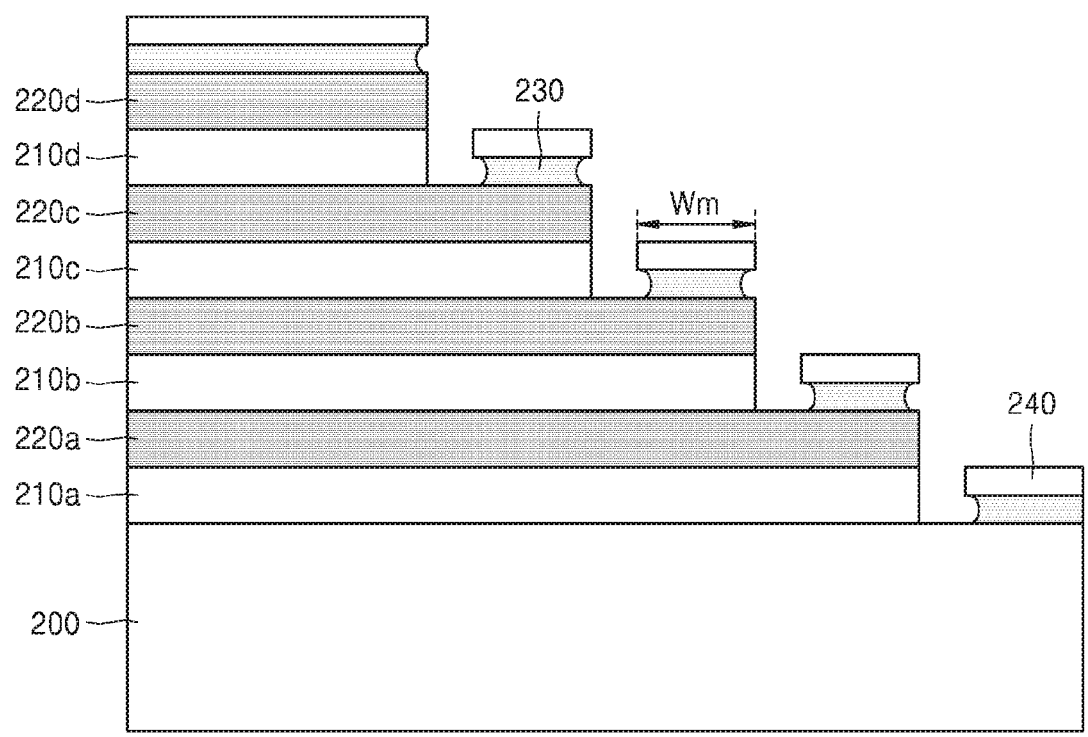

Referring to FIG. 13, an operation of etching at least a portion of the second sacrificial layer 230 is performed. The etching may be isotropic etching. More particularly, the etching operation may be performed by using a wet etching process and may be performed by using, for example, phosphoric acid or hydrofluoric acid. Due to the second insulating layer 240 left on the upper surface U and the lower surface L of the stepped structure, only the second sacrificial layer 230 on the side surface S may be removed and the second sacrificial layer 230 on the upper surface U and the lower surface L may be left. Also, during the isotropic etching, due to the second insulating layer 240 left on the upper surface U and the lower surface L of the stepped structure, the second sacrificial layer 230 having a width smaller than the width of the second insulating layer 240 left on the upper surface U and the lower surface L of the stepped structure may be formed.

Figure 14:
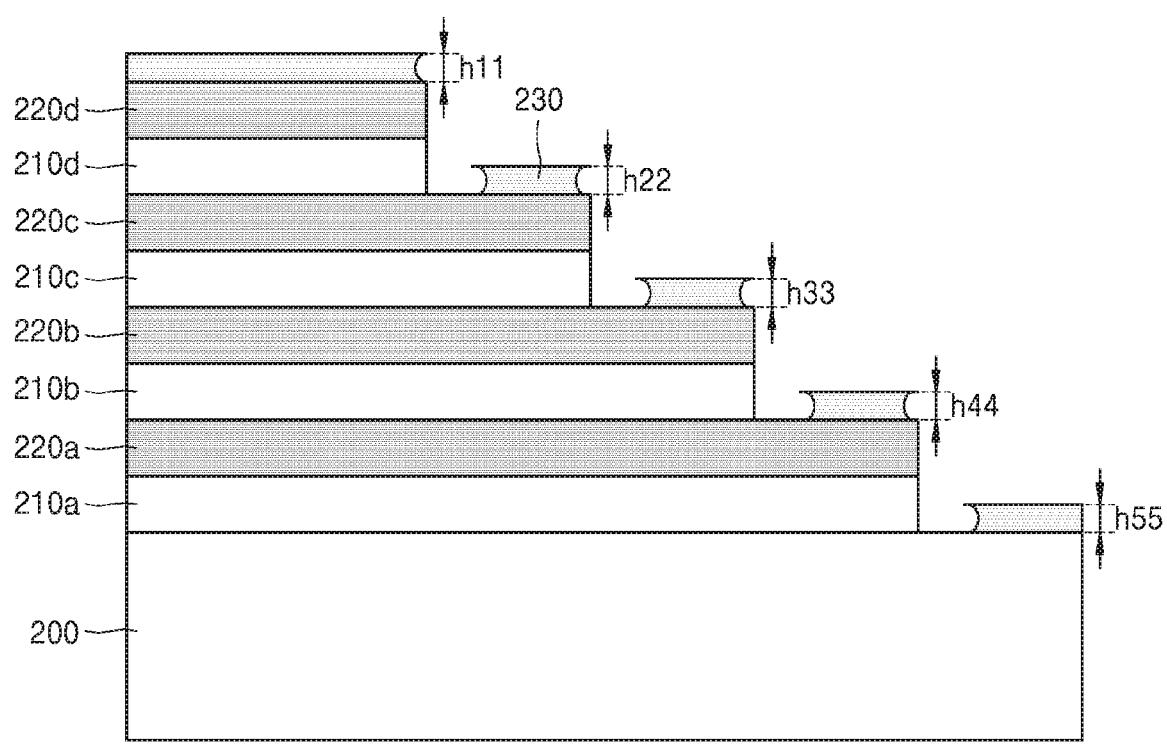

Referring to FIG. 14, an operation of etching the second insulating layer 240 left on the upper surface U and the lower surface L of the stepped structure is performed. As such, only the portion of the second insulation layer 240 that is densified during the asymmetric plasma post-treatment process may be removed.

During the operations of FIGS. 11, 12, 13 and 14, the densified portion of the second sacrificial layer 230, that is, the second sacrificial layer 230 formed on the upper surface U and the lower surface L may not be etched and thus the thickness thereof may be maintained. For example, when the thickness of the second sacrificial layer 230 deposited in the process of FIG. 10 is "h", the thickness of the second sacrificial layer 230 left on each step of the stepped structure may also be "h". That is, in the case of FIG. 14, $h11=h22=h33=h44=h55=h$ may be satisfied. This has a technical meaning in that it may be possible to minimize or avoid variation in the thicknesses of the second sacrificial layers on the respective steps of the stepped structure.

Figure 15:
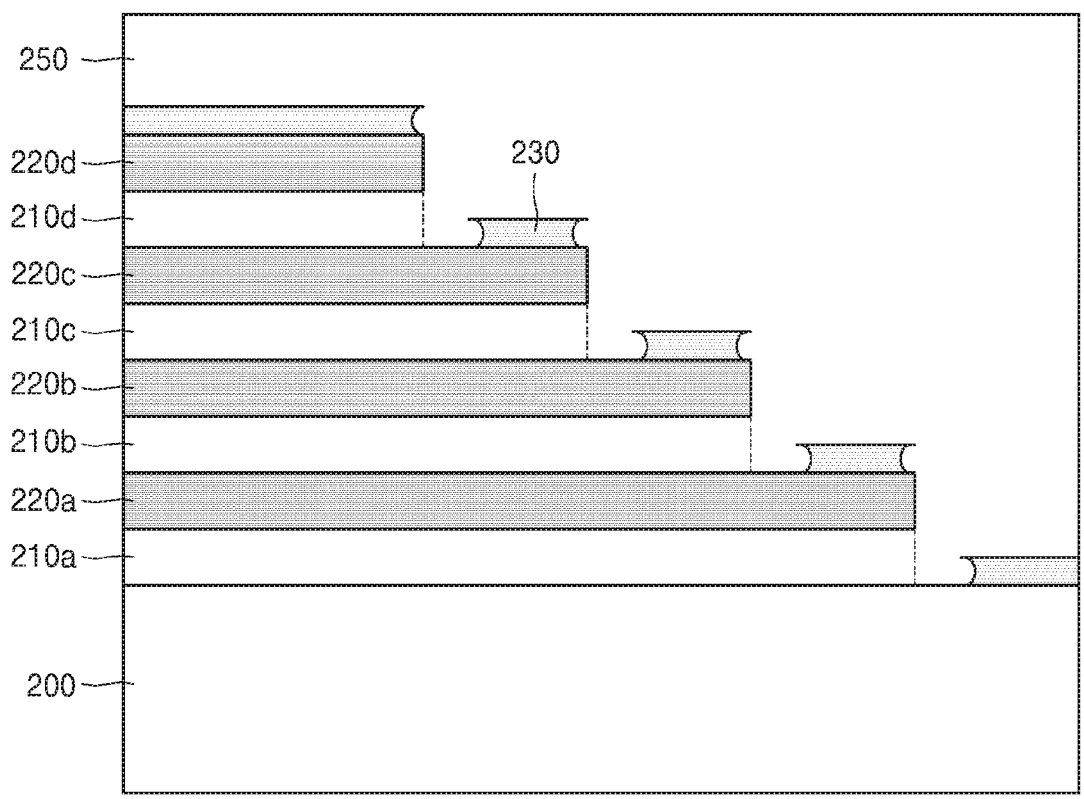

Referring to FIG. 15, an inter-layer insulating layer 250 is formed on a sacrificial word line structure including a first sacrificial layer (220 of FIG. 15) and a second sacrificial layer (230 of FIG. 15). The inter-layer insulating layer 250 may be formed of the same material as the first insulating layer 210 of the stepped structure. For example, the first sacrificial layer 220 of the stepped structure may be a silicon nitride layer, the first insulating layer 210 of the stepped structure may be a silicon oxide layer, and the inter-layer insulating layer 250 may be a silicon oxide layer.

Figure 16:
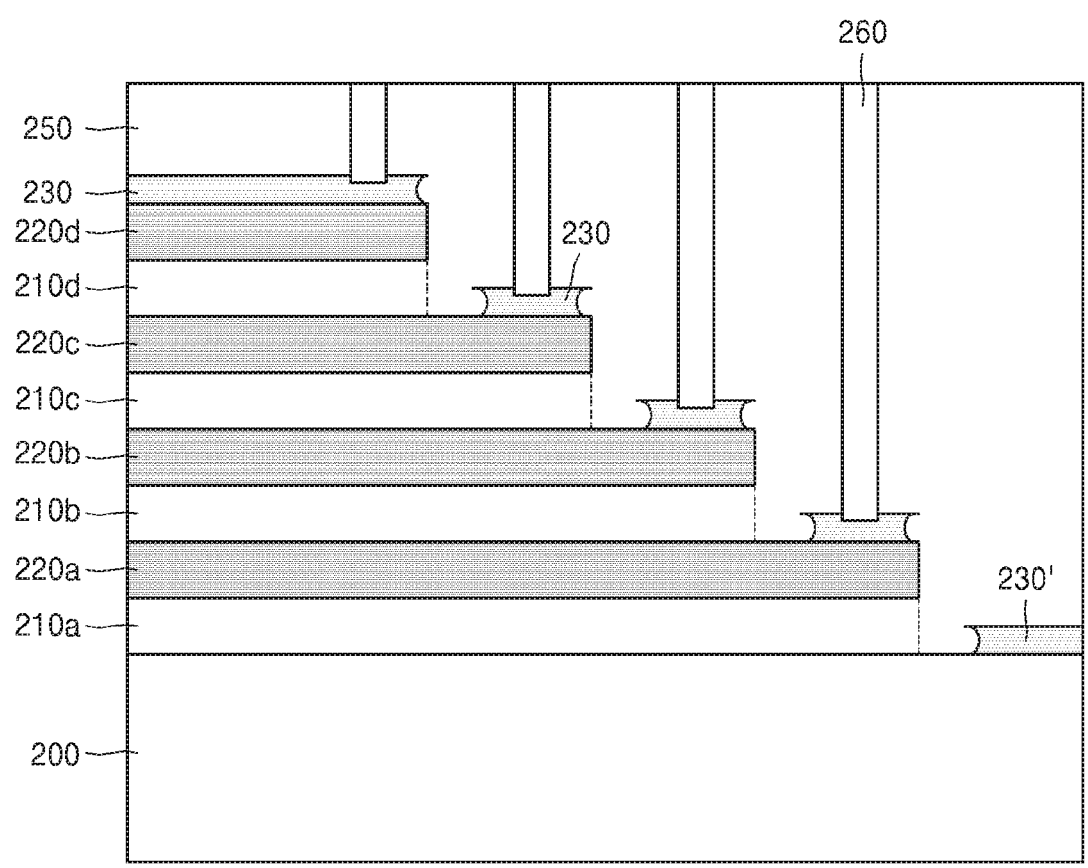

Referring to FIG. 16, on the upper surface of the inter-layer insulating layer 250, via contacts 260 connected to at least a portion of the second sacrificial layer 230 are formed through patterning. In an alternative embodiment, via contacts 260 may be formed after the first sacrificial layer 220 and the second sacrificial layer 230 are etched to form a conductive word line structure.

Figure 17:
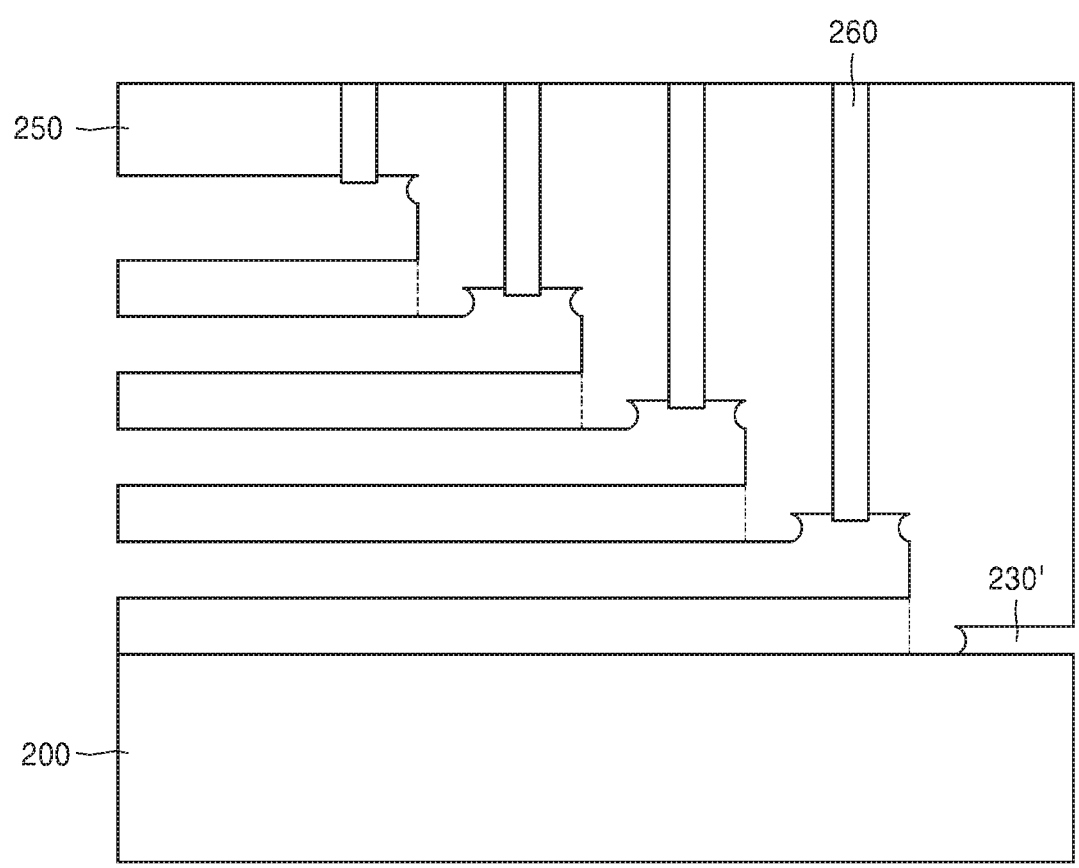

Referring to FIG. 17, the first sacrificial layer 220 and the second sacrificial layer 230 are etched to expose a channel (not illustrated), the first insulating layer 210, the inter-layer insulating layer 250, and the via contacts 260. Accordingly, the sacrificial word line structure may be removed. In an alternative embodiment, during the sacrificial layer etching operation, a second sacrificial layer (230' of FIG. 16) formed on the substrate 200 may also be simultaneously removed and thus a portion of the upper surface of the substrate 200 may be exposed.

Figure 18:
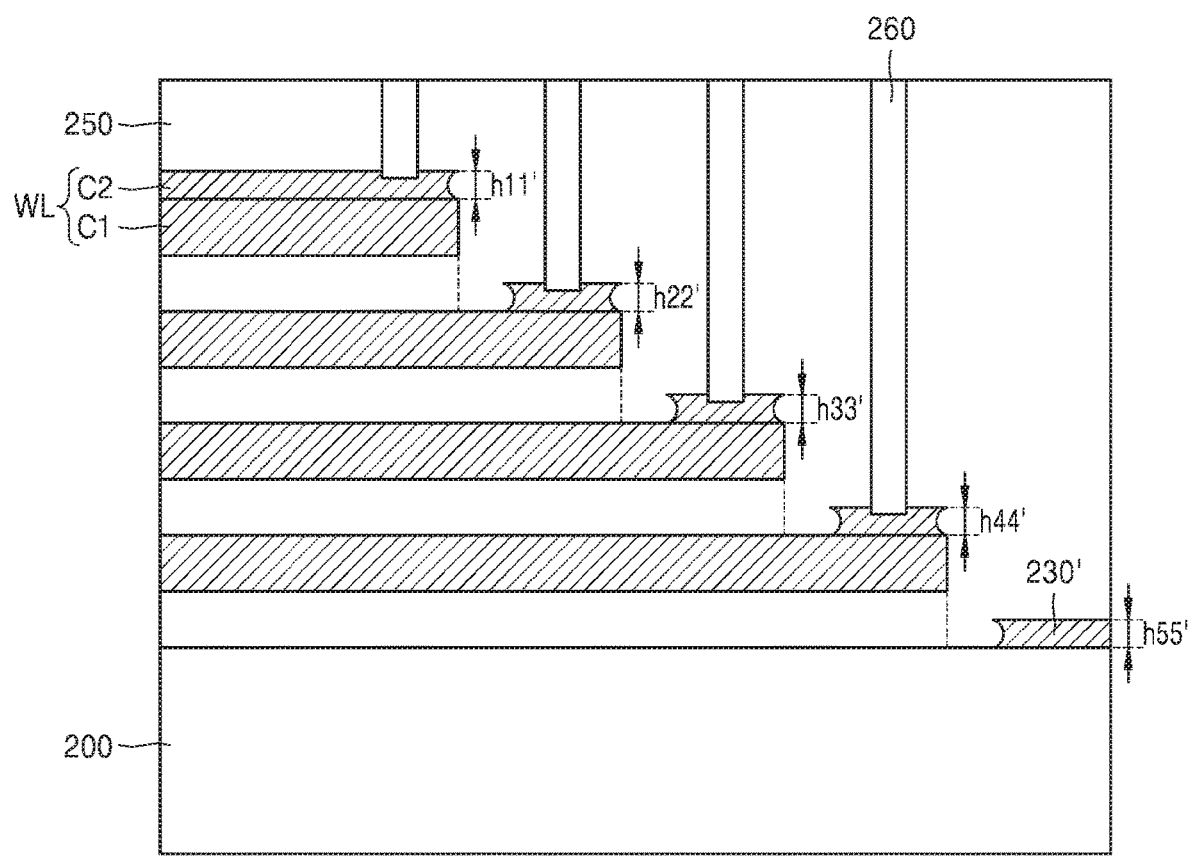

Referring to FIG. 18, a conductive word line structure WL is formed through the exposed space. The conductive word line structure WL may be formed to correspond to a space from which the sacrificial word line structure is removed. The conductive word line structure WL may be tungsten and may include at least one or a combination of various conductive materials such as copper and polysilicon.

The conductive word line structure WL thus formed may include the following configuration.

A first conductive layer C1 (corresponding to the first sacrificial layer (220 of FIG. 16)) extending toward the channel)
 A second conductive layer C2 (corresponding to the second sacrificial layer (230 of FIG. 16)) located on one end of the first conductive layer)

In other words, the first conductive layer C1 and the second conductive layer C2 included in the conductive word line structure WL are caused by the layers (i.e., sacrificial layers) formed through different processes.

As described above with reference to FIGS. 6H and 14, according to embodiments of the present disclosure, since the second insulating layer is additionally deposited, the second sacrificial layer located on the upper surface and the lower surface of the stepped structure may not be etched during the etching process. Thus, the thicknesses of the second sacrificial layers left on the respective steps of the stepped structure may be equal to each other. Accordingly, as illustrated in FIG. 18, the second conductive layers C2 of the conductive word line structures WL may have the same thickness (i.e., $h11'=h22'=h33'=h44'=h55'$). Also, as described above, since the second sacrificial layer on the side surface of the stepped structure is isotropically etched by using the second insulating layer as an etch mask, a recess region may be formed in the second sacrificial layer existing on the upper surface and the lower surface of the stepped structure. Accordingly, the second conductive layer C2 of the conductive word line structures WL may also have portions recessed in the side direction from both sidewalls thereof. That is, each of both sidewalls of the second conductive layer C2 may have a portion recessed from the sidewall toward the other sidewall. The recessed portion may have a round shape or a shape having a predetermined curvature. Accordingly, the side-direction (y-axis direction) width of the center portion of the second conductive layer C2 may be smaller than the side-direction width of the upper surface and the lower surface of the second conductive layer C2.

Also, as described above with reference to FIGS. 6H and 14, the second sacrificial layers formed on the respective steps of the stepped structure may be spaced apart from each other in the third direction (e.g., the y-axis direction). Accordingly, as illustrated in FIG. 18, the respective second conductive layers C2 of the conductive word line structures WL may also be formed spaced apart from each other. Particularly, the second conductive layers C2 may be formed spaced apart from each other in all directions including the third direction (the y-axis direction). Accordingly, a second conductive layer C2 may not be located on a vertical extension line from the upper surface of another second conductive layer C2. As described above with reference to FIGS. 6I and 6J, this has a technical meaning in that it may be possible to minimize or avoid the risk of shorting that may otherwise be present from the via contact hole connecting through a second conductive layer to another second conductive layer due to the excessive etching.

Figure 19:
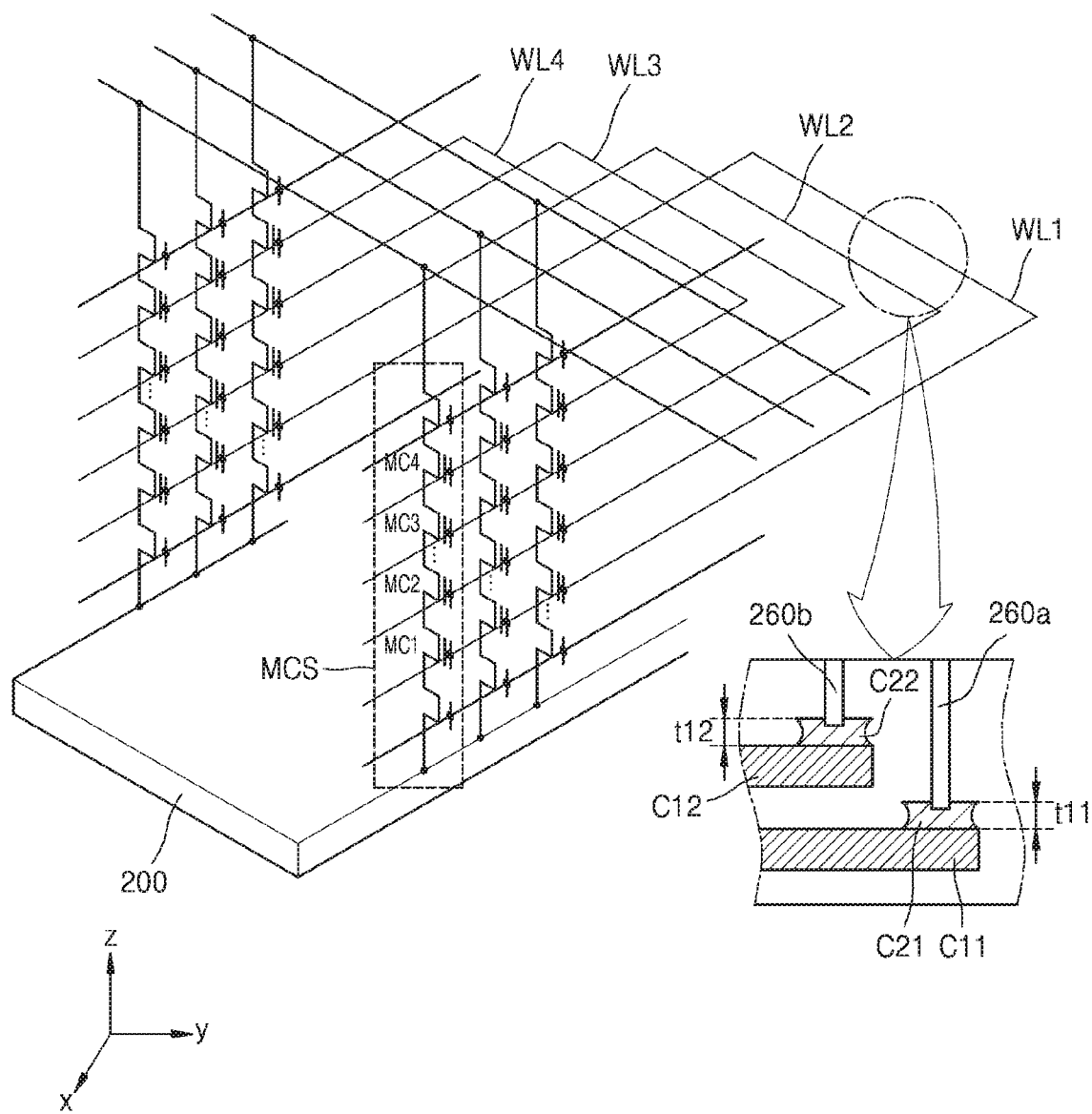
FIG. 19 illustrates a semiconductor device formed by a substrate processing method according to embodiments of the present disclosure.

FIG. 19 is a circuit diagram of a semiconductor device according to an embodiment of the present disclosure. The semiconductor device may be formed by the substrate processing method according to the above embodiments. Hereinafter, redundant descriptions between the embodiments will be omitted for conciseness.

Referring to FIG. 19, a semiconductor memory device may include a substrate 200, a memory cell string MCS, a first word line WL1, a second word line WL2, a third word line WL3, and a fourth word line WL4.

The memory cell string MCS may have a structure protruding and extending on the substrate 200. The memory cell string MCS may include a plurality of memory cells. Although only four memory cells are illustrated in FIG. 19, one memory cell string MCS may include fewer or more memory cells as necessary.

The first word line WL1 may be connected to the first memory cell MC1. For example, the first word line WL1 may be formed to extend toward the channel of the first memory cell MC1. Likewise, the second to fourth word lines WL2 to WL4 may be connected to the second to fourth memory cells MC2 to MC4 respectively, and the second to fourth word lines WL2 to WL4 may be formed to extend toward the channels of the second to fourth memory cells MC2 to MC4 respectively.

At least two of the first to fourth word lines WL1 to WL4 may include the word line structure formed through the operation illustrated in FIG. 18. For example, the first word line WL1 and the second word line WL2 may include the word line structure formed through the operation illustrated in FIG. 18. In this case, the first word line WL1 may include a first conductive layer C11 extending toward the channel and a second conductive layer C21 on the first conductive layer C11. The second word line WL2 may include a first conductive layer C12 extending toward the channel and a second conductive layer C22 on the first conductive layer C12. A thickness t11 of the second conductive layer C21 of the first word line WL1 may be equal to a thickness t12 of the second conductive layer C22 of the second word line WL2. Also, as illustrated in FIG. 19, each of the second conductive layer C21 of the first word line WL1 and the second conductive layer C22 of the second word line WL2 may have a portion recessed in the side direction from each of both sidewalls thereof such that the side-direction width of the center portion thereof may be smaller than the side-direction width of the upper surface and the lower surface thereof. The recessed portion may have a round shape or a shape having a predetermined curvature. As described above, this is because the second sacrificial layer on the side surface S of the stepped structure is isotropically etched by using the second insulating layer as an etch mask. Also, the second conductive layer C21 of the first word line WL1 and the second conductive layer C22 of the second word line WL2 may not overlap each other in the direction (the z-axis direction) perpendicular to the upper surface of the second conductive layer C21 of the first word line WL1.

The substrate processing method according to the embodiments of the present disclosure may minimize the exposure of the barrier layer to the etching solution by additionally depositing the insulating layer on the barrier layer and may maintain the thickness of the barrier layer deposited from the top to the bottom of the stepped structure. As such, the substrate processing method according to the embodiments of the present disclosure may prevent the thickness of the landing pads deposited on each step from becoming non-uniform in the process of selectively depositing the landing pad on the stepped structure. Accordingly, it may be possible to reduce the risk of shorting when the sacrificial layer of the stepped structure is replaced with a metal layer.

It is to be understood that the shape of each portion in the accompanying drawings is illustrative for a clear understanding of the present disclosure. It should be noted that the present disclosure may be modified into various shapes other than the illustrated shapes. Like reference numerals in the drawings may refer to like elements.

It will be apparent to those of ordinary skill in the art that the present disclosure is not limited to the above embodiments and the accompanying drawings and various substitutions, modifications, and alterations may be made therein without departing from the spirit and scope of the present disclosure.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:
    stacking a stack structure comprising an insulating layer and a sacrificial layer a plurality of times;
    etching the stack structure such that the stack structure includes an upper surface, a lower surface, and a side surface connecting the upper surface and the lower surface;
    forming a barrier layer on the upper surface, the lower surface, and the side surface of the stack structure to cover the stack structure;
    forming a mask layer over the barrier layer on the upper surface, the lower surface, and the side surface of the stack structure to cover the barrier layer;
    exposing at least a first portion of the barrier layer by etching at least a first portion of the mask layer;
    etching the exposed first portion of the barrier layer; and
    etching the mask layer.

2. The substrate processing method of claim 1, wherein a thickness of a second portion of the barrier layer located on the upper surface and the lower surface of the stack structure is uniform during the exposing of the first portion of the barrier layer and during the etching of the exposed first portion of the barrier layer and the etching of the mask layer.

3. The substrate processing method of claim 1, wherein the etching of the exposed first portion of the barrier layer comprises isotropically etching the exposed first portion of the barrier layer to form a barrier layer smaller in width than a second portion of the mask layer located on the upper surface and the lower surface of the stack structure.

4. The substrate processing method of claim 1, wherein the exposing of the first portion of the barrier layer comprises etching the first portion of the mask layer on the side surface of the stack structure.

5. The substrate processing method of claim 1, further comprising selectively densifying a second portion of the barrier layer located on the upper surface and the lower surface of the stack structure among the barrier layer before the forming of the mask layer.

6. The substrate processing method of claim 1, wherein an etch rate of a second portion of the barrier layer located on the upper surface and the lower surface of the stack structure is lower than an etch rate of a third portion of the barrier layer located on the side surface of the stack structure during the etching of the exposed first portion of the barrier layer.

7. The substrate processing method of claim 1, further comprising selectively densifying a second portion of the mask layer located on the upper surface and the lower surface of the stack structure before the exposing.

8. The substrate processing method of claim 1, wherein:
    the sacrificial layer and the barrier layer form a sacrificial word line structure,
    the substrate processing method further comprises:
        forming an inter-layer insulating layer on the sacrificial word line structure;
        removing the sacrificial word line structure; and
        forming a conductive word line structure in a corresponding space from which the sacrificial word line structure is removed,
    the conductive word line structure comprises:
        a first conductive layer extending toward a channel; and
        a second conductive layer on the first conductive layer, and
        wherein the second conductive layer has first and second sidewalls opposing each other, and wherein each of the sidewalls has a portion recessed toward the other sidewall.

9. The substrate processing method of claim 1, wherein the stack structure has a step shape.

\* \* \* \* \*